(12) United States Patent
Morimoto

(10) Patent No.: US 7,558,099 B2
(45) Date of Patent: Jul. 7, 2009

(54) METHOD OF CONTROLLING THE RESISTANCE IN A VARIABLE RESISTIVE ELEMENT AND NON-VOLATILE SEMICONDUCTOR MEMORY DEVICE

(75) Inventor: Hidenori Morimoto, Kashihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 335 days.

(21) Appl. No.: 11/702,109

(22) Filed: Feb. 5, 2007

(65) Prior Publication Data

US 2007/0195581 A1    Aug. 23, 2007

(30) Foreign Application Priority Data

Feb. 23, 2006  (JP)  ............................. 2006-046234

(51) Int. Cl.
    *G11C 11/00*  (2006.01)
(52) U.S. Cl. ..................................... 365/148
(58) Field of Classification Search ............. 365/80, 365/83, 85, 148, 158, 171, 173; 257/421, 257/E21.665; 438/3; 977/933, 934, 935
    See application file for complete search history.

(56) References Cited

U.S. PATENT DOCUMENTS

2003/0086285 A1*  5/2003  Yamaguchi ............. 365/145
2003/0161182 A1*  8/2003  Li et al. ............... 365/185.02
2004/0257864 A1* 12/2004  Tamai et al. ........... 365/158
2004/0264244 A1* 12/2004  Morimoto .............. 365/180

OTHER PUBLICATIONS

"Novell Colossal Magnetoresistive Thin Film Nonvolatile Resistance Random Access Memory (RRAM)" by W.W. Zhung et al, IEDM in 2002.
"Evaluation of SiO₂ antifuse in a 3D-OTP memory" by Feng Li et al, IEEE Transactions on Device and Materials Reliability, vol. 4, No. 3(2004), pp. 416-421.
"Highly Scalable Non-volatile Resistive Memory using Simple Binary Oxide Driven by Asymmetric Unipolar Voltage Pulses" by I. G. Bake et al, IEDM in 2004.

* cited by examiner

*Primary Examiner*—Richard Elms
*Assistant Examiner*—Harry W Byrne
(74) *Attorney, Agent, or Firm*—Nixon & Vanderhye, P.C.

(57) ABSTRACT

The method of controlling a resistance of a variable resistive element comprises a forming step for shifting the variable resistive element from an initial state after the production to a variable resistance state capable of a stable mono-polar switching action where a variable resistive characteristic of the variable resistive element is turned to a program resistive characteristic by applying a program voltage pulse to the variable resistive element for first pulse application time and to an erase resistive characteristic by applying an erase voltage pulse equal in polarity to the program voltage pulse to the variable resistive element for second pulse application time longer than the first pulse application time, wherein one or more forming voltage pulses equal in polarity to the program voltage pulse is applied to the variable resistive element for third pulse application time longer than the second pulse application time.

11 Claims, 24 Drawing Sheets

METHOD OF CONTROLLING THE RESISTANCE IN A VARIABLE RESISTIVE ELEMENT AND NON-VOLATILE SEMICONDUCTOR MEMORY DEVICE

CROSS REFERENCE TO RELATED APPLICATION

This Nonprovisional application claims priority under 35 U.S.C. §119(a) on Patent Application No. 2006-046234 filed in Japan on Feb. 23, 2006, the entire contents of which are hereby incorporated by reference.

BACKGROUND OF THE INVENTION

1. Field of the Invention

The present invention relates to a non-volatile semiconductor memory device having an array of variable resistive elements of two-port structure type and particularly to a resistance controlling method of applying a voltage pulse to the two ports of a variable resistive element of interest to change the resistance characteristic of the variable resistive element.

2. Description of the Related Art

There will be an epoch where desired data can be obtained and kept at any time and any location. As mobile devices such as mobile telephones or PDAs (portable, personal data communication devices) have been spread in the market, they allow various data to be accessed with no limitations of time and location. However, the primary functions of such mobile devices including the life of batteries and the speed of access to data remain not high enough to be satisfied and will hence be demanded for much improvement. In particular, while the life of batteries is one of the essential requirements which determine the utilization of a mobile device, the power consumption for components in the mobile device has to be significantly minimized.

One of the key devices for satisfying the foregoing requirement is a non-volatile semiconductor memory. When such a mobile device is active in motion, its logic circuit for conducting logic functions may be predominant in the power consumption. In a standby mode, the power consumption of a memory device may be increased most. It is not negligible that the power consumption at the standby mode disturbs the lengthening of the life of batteries in a mobile device. The supply of power to a memory device in the standby mode may be eliminated when the memory device is replaced by a non-volatile semiconductor memory which can minimize the power consumption at the standby mode.

Such non-volatile semiconductor memories include flash memories and FeRAMs (ferroelectric random access memories) which have already been introduced in the market. Those memories have however trade-off relationships between the high-speed operation, the durability to write actions, the power consumption, and other primary properties. Further actions of research and development of ideal non-volatile semiconductor memories are now on the way for satisfying all the requirements.

As some expedient non-volatile semiconductor memories employing new materials have been proposed, one of them is a resistance random access memory (RRAM) which comprises an array of non-volatile memory elements of the variable resistance type (variable resistive elements), each element having a layer structure of a lower electrode, a metal oxide, and an upper electrode, so that the electric resistive characteristic is reversibly varied between the lower electrode and the upper electrode when an electrical stress is applied to between the same. Since RRAM is highly potential to improve the operational speed, the storage size, and the energy saving, its advantages will be expected in the future.

A variable resistive element for use in RRAM is disclosed in "Novel colossal random access memory (RRAM)" by Zhuang, H. H., et al, IEDM, Article No. 7.5, December 2002, (will be referred to as Citation 1) which has a perovskite crystalline structure made of a manganese oxide material, namely $Pr_{1-x}Ca_xMnO_3$ (0<x<1, abbreviated to as PCMO) to gain the characteristics of colossal magnetoresistance (CMR) and high temperature super conductivity (HTSC) and arranged to be applied with a voltage pulse for modifying the resistance.

The resistance modifying property of the variable resistive element is practically denoted by a profile shown in FIG. 21 where the vertical axis represents the resistance and the horizontal axis represents the number of applications of pulses when the PCMO layer at 100 nm of thickness is applied with a 100 nanoseconds voltage pulse of ±5 V. Upon the application of pulses, the resistance is varied between 1 k$\Omega$ and 1 M$\Omega$ as reversed more than 100 times within a range of three digits. Also as shown in a profile of FIG. 22 where the vertical axis represents the resistance and the horizontal axis represents the number of applications of a 5 nanoseconds voltage pulse at 4 V, the resistance of the variable resistive element is varied in steps depending on the number of applications of the voltage pulse. The resistance changes not only between two levels, a low resistance level (for example, not higher than 1 k$\Omega$) and a high resistance level (for example, not lower than 100 k$\Omega$), but also among any desired number of different levels between the two extremes. For example, the resistance states may represent four different levels between 10 k$\Omega$ and 1 M$\Omega$ as shown in FIG. 23 as remaining low in the bit cost. When having an array of the described variable resistive elements as memory cells, a non-volatile semiconductor memory device can be improved in the operational speed and the storage size.

Also for increasing the storage size of an RRAM device, an attempt has been made as disclosed in "Evaluation of $SiO_2$ antifuse in a 3D-OTP memory" by Feng Li et al, IEEE Transactions on Device and Materials Reliability, Vol. 4, No. 3 (2004), pp. 416-421 (referred to as Citation 2), where arrays of memory cells are arranged vertically in layers on a substrate surface to increase the storage size per unit area and minimize the production cost per bit. The three dimensional semiconductor memory device of Citation 2 is hence a non-volatile OTP memory device which has a 3D structure in which arrays of the memory cells are arranged vertically in layers on the substrate for permitting one time of the program action. More specifically, the memory cell arrays of cross-point type in which each memory element is located at the intersection between a word line and a bit line are placed one over another in the vertical to construct a four-layer structure.

The memory device of Citation 2 has the layers of its memory cells made of polycrystalline silicon. The memory cell area per bit is commonly 4 $F^2$. The unit "F" is the minimum of measurement to be used in the production process. The memory device is equal in the memory cell area to a flash memory which employs the same design rules. Since the 3D semiconductor memory device has a four-layer structure of the memory cell arrays, the memory cell area is practically ¼ of the size 4 $F^2$, or 1 $F^2$. Accordingly, the memory device is smaller in the production cost than the flash memory. Each memory cell in the memory cell arrays comprises a state variable region called an antifuse and a diode as the selectable region connected in series to each other and is connected at its two ends to a word line and a bit line, respectively. The antifuse is provided in the form of a silicon oxide layer while the diode is provided in the form of a layer stack of p-type silicon and n-type silicon. The storage of a data is based on a change in the resistance of the antifuse when the memory cell is applied with a voltage. The antifuse remains at higher level of insulating state in the initial state and can be turned to a conductive state when receiving a voltage higher than the threshold. Once the antifuse is shifted to the conductive state, it will not return back to the insulating state, thus allowing one time of the program action. The diode is connected for inhibiting a leak current across a memory cell to be selected.

When an RRAM is structured by the above described 3D memory cell structure, its readout action can be improved in the repeatability and the utilization but its write action can not be performed (by programming and erasing) with the use of a voltage of two, positive and negative, polarities because of the rectifying property of the diode. Another attempt has hence been proposed as disclosed in "Highly scalable non-volatile resistive memory using simple binary oxide driven by asymmetric unipolar voltage pulses" by I. G. Baek et al, IEDM Technical Digest, December 2004, pp. 587-590 (referred to as Citation 3) which employs a mono-polar switching technology in which the write action is performed by modifying the pulse width of the voltage pulse to be applied to the variable resistive element (RRAM element) in the memory cell for programming or erasing so as to distinguish the program action and the erase action. Accordingly, the resultant non-volatile semiconductor memory device having memory cells with the rectifying property and the cross-point type memory cell array structure can electrically be written while remaining increased in the storage size.

It is however necessary for carrying out the mono-polar switching action over each variable resistive element to shift the variable resistive element from its initial state after the production to a variable resistance state through application of a forming voltage pulse. For example, the memory device of Citation 3 is applied with a forming voltage pulse which is higher than that of the program and erase action in order to develops a current path such as a filament in its variable resistive element which remains not conductive at the initial state after the production.

However, there is no satisfactory solution over the relationship between the condition for applying the forming voltage pulse to shift from the initial state to the variable resistance state for enabling the mono-polar switching action and the resistant property in the variable resistance state. The condition for applying the voltage pulse to conduct the erase action and the program action in the mono-polar switching action when the forming voltage pulse has been applied has to be set to an optimum depending on the characteristic of each sample.

SUMMARY OF THE INVENTION

The present invention has been developed in view of the above aspects and its first object is to provide a method of controlling the resistance of a variable resistive element capable of a mono-polar switching action which is conducted depending on the condition for application of a forming voltage pulse in order to shift the variable resistive element of a two-port structure type to a variable resistance state capable of the mono-polar switching action. The second object of the present invention is to provide a non-volatile semiconductor memory device which includes the variable resistive elements capable of the mono-polar switching action at stable and appropriate resistance modifying property.

For achievement of the first object, a method of controlling the resistance of a variable resistive element according to the present invention comprises a forming step of forming the variable resistive element so as to be a variable resistance state capable of a mono-polar switching action where a variable resistive characteristic of the variable resistive element is turned to a program resistive characteristic when a program voltage pulse is applied to the variable resistive element for first pulse application time and to an erase resistive characteristic when an erase voltage pulse equal in the polarity to the program voltage pulse is applied to the variable resistive element for second pulse application time longer than the first pulse application time. As the first feature of the present invention, the forming step is characterized in that one or more forming voltage pulses equal in the polarity to the program voltage pulse are applied to the variable resistive element for third pulse application time longer than the second pulse application time.

In the present invention, the pulse application time of the voltage pulse to be applied to the variable resistive element is a time in which pulses are applied in a succession when the voltage pulse is applied two or more times. Unless otherwise specified, the pulse application time means a time in which pulses are applied in a succession.

The method of controlling the resistance of the variable resistive element of the first feature is further characterized as the second feature in that the resistance of the variable resistive element after the forming step is controlled through modifying the third pulse application time.

The method of controlling the resistance of the variable resistive element of the first or second feature is further characterized as the third feature in that the variable resistive element is taking a first resistance varying state, a second resistance varying state, and a third resistance varying state in order as the pulse application time progresses in the forming step, wherein the resistance is not largely varied from an initial resistance and remains substantially constant in a first resistance varying state, the resistance is varied towards a peak value in a second resistance varying state, and the resistance is varied in a reverse direction from the peak value to the initial resistance in a third resistance varying state.

The method of controlling the resistance of the variable resistive element of the third feature is further characterized as the fourth feature in that the forming voltage pulse is applied in the forming step at least until the variable resistive element is shifted from the second resistance varying state to the third resistance varying state.

The method of controlling the resistance of the variable resistive element of the fourth feature is further characterized as the fifth feature in that the application of the forming voltage pulse is finished in the forming step just before the resistance of the variable resistive element returns back to the initial resistance.

The method of controlling the resistance of the variable resistive element of any of the third to fifth features is further characterized as the sixth feature in that the initial resistance is at a low resistance state, the peak value is at a higher resistance state than the initial resistance, the program resistive characteristic represents a high resistive characteristic, and the erase resistive characteristic represents a low resistive characteristic.

The method of controlling the resistance of the variable resistive element of any of the preceding features is further characterized as the seventh feature in that the absolute value of an applied voltage of the program voltage pulse is higher than the absolute value of an applied voltage of the erase voltage pulse.

For achievement of the second object, a non-volatile semiconductor memory device according to the present invention is characterized as the first feature by comprising a memory cell of a two-port structure including a variable resistive element of which a resistive characteristic is varied by application of a voltage pulse to both ends, and a voltage pulse applying circuit capable of applying to both ends of the variable resistive element in the memory cell the forming voltage pulse in the forming step of the method of controlling the resistance of the variable resistive element of any of the preceding features, a program voltage pulse and an erase voltage pulse in a mono-polar switching action where the program voltage pulse is applied to the variable resistive element for first pulse application time in order to shift a variable resistive characteristic of the variable resistive element to a program resistive characteristic and the erase voltage pulse equal in the polarity to the program voltage pulse is applied to the variable resistive element for second pulse application time longer than the first pulse application time in order to shift the variable resistive characteristic of the variable resistive element to an erase resistive characteristic.

The non-volatile semiconductor memory device of the first feature is further characterized as the second feature in that the variable resistive element in the memory cell become capable of the mono-polar switching action when subjected to the forming step.

The non-volatile semiconductor memory device of the first or second feature is further characterized as the third feature in that the memory cell comprises a series circuit of the variable resistive element and a nonlinear element.

The non-volatile semiconductor memory device of the first or second feature is further characterized as the fourth feature in that the memory cell has a two-port structure comprising a series circuit of the variable resistive element and a diode.

During the mono-polar switching action for controlling the resistance of the variable resistive element, the resistance or resistive characteristic of the variable resistive element is shifted to the high resistance state by one of two different pulse widths of the voltage pulse which are equal in the polarity or to the low resistance state by the other of the two different pulse widths of the voltage pulse. It is presumed for enabling the mono-polar switching action there is a critical point in the application time of the voltage pulse, where the resistance change is reversed, between the application of one of the two different widths of the voltage pulse and the application of the other. More particularly, the application of the pulse width of the voltage pulse not exceeding the critical point shifts the resistance from one, low or high, resistance level to the opposite, high or low, resistance level. Then, the application of the pulse width of the voltage pulse exceeding the critical point shifts back the resistance to the original, low or high, resistance level. In brief, the mono-polar switching characteristic or variable resistive characteristic (the variable resistance state capable of the mono-polar switching action) is profiled as schematically illustrated in FIG. 24 where the vertical axis represents the resistance of the variable resistive element and the horizontal axis represents the application time of the voltage pulse (in logarithm).

It is found through a series of studies by the inventors of this application that the variable resistive characteristic of the variable resistive element of the two-port structure, which has a variable resistor of a type sandwiched between two electrodes, is different at the initial state after the production from the profile of the mono-polar switching characteristic schematically shown in FIG. 24 as remains hardly varied in a simple resistance varying period extending from the application of the pulse voltage to the critical point in the mono-polar switching action.

FIGS. 10 to 12 illustrate combinations of the variable resistive characteristic at the initial level and the profile of the mono-polar switching action. FIGS. 10 to 12 are different in the application time of the forming voltage pulse for shifting the resistive characteristic of the variable resistive element from the initial resistive characteristic to the mono-polar switching characteristic. As shown in FIGS. 10 to 12 with respect to the variable resistive characteristic at an initial state, the resistance is monotonously varied (monotonously increased in FIGS. 10 to 12) to the critical point of the initial state in the application time of the forming voltage pulse. When the forming voltage pulsed is continuously applied after the critical point, the resistance is then varied in a reverse direction and returned back to its initial resistance state (See FIG. 10). When the application of the forming voltage pulse is canceled at a midway between the critical point and the point where the resistance returns back to its initial resistance state, the profile of the mono-polar switching action becomes different thereafter. In FIGS. 10 to 12, when the application of the forming voltage pulse is canceled at an earlier moment after the critical point of the initial state, the profile of the mono-polar switching action becomes greater in the variation of the resistance. It is also apparent that the reference level of the resistance in the mono-polar switching action is determined by the resistance level at when the application of the forming voltage pulse is canceled with the variable resistive characteristic at the initial state.

It is hence understood from the experimental profiles shown in FIGS. 10 to 12 that the variable resistive element showing the mono-polar switching characteristic allows the application time of the program voltage pulse and the application time of the erased voltage pulse in the mono-polar switching action to be shorter than the application time before the canceling of the forming voltage pulse. The program action in FIGS. 10 to 12 is equal to the shift of the variable resistive element from the low resistance state to the high resistance state while the erase action is equal to the shift from the high resistance state to the low resistance state. This assignment is predetermined because the application time of the erase voltage pulse is close to the critical point of the variable resistive characteristic at the initial state before the application of the forming voltage pulse and, when the application of the forming voltage pulse is canceled before the critical point, the resistance is continuously varied by the application of the succeeding voltage pulse along the variable resistive characteristic at the initial state so that the variable resistive element remains not favorably shifted to the mono-polar switching characteristic.

Accordingly, the method of controlling the resistance of a variable resistive element of the first feature allows the variable resistive element to be shifted from the initial resistive characteristic after the production to the variable resistance state capable of the mono-polar switching action in the forming step, hence making the mono-polar switching action stable and consistent.

The method of controlling the resistance of a variable resistive element of the second feature allows both the low resistance level and the high resistance level of the variable resistive element for the mono-polar switching action to be controllably modified by the application time of the forming voltage pulse, hence increasing the freedom of design of memory cell currents required for conducting the program action and the erase action and improving the program action and the erase action on the variable resistive element.

The method of controlling the resistance of a variable resistive element of the third feature allows the resistive characteristic at the initial state of the variable resistive element before the forming step to be highly favorably for executing the method, hence being improved in the advantageous effect.

The method of controlling the resistance of a variable resistive element of the fourth feature allows the variable resistive element to be positively shifted to the variable resistive characteristic capable of the mono-polar switching action in the forming step.

The method of controlling the resistance of a variable resistive element of the fifth feature allows the low resistance state and the high resistance state of the variable resistive element after the forming step to be significantly distinguished in the mono-polar switching action, hence increasing the stableness of the mono-polar switching action and providing a generous margin of operation in the readout action.

The method of controlling the resistance of a variable resistive element of the sixth feature allows the variable resistive element, of which the resistive characteristic at the initial state after the production is shown in FIGS. 10 to 12, to perform the mono-polar switching action after the forming step.

The method of controlling the resistance of a variable resistive element of the seventh feature allows the application time of the program voltage pulse to be minimized, hence speeding up the program action.

The non-volatile semiconductor memory device of the first or second feature allows the voltage pulse applying circuit to correctly carry out the forming step in the method of controlling the resistance of a variable resistive element of the first feature. As the result, the variable resistive element capable of the mono-polar switching action can be accomplished by the forming step while the mono-polar switching action is certainly conducted by the action of the voltage pulse applying circuit, whereby the non-volatile semiconductor memory device is applicable to the mono-polar switching action.

The non-volatile semiconductor memory device of the third feature allows the nonlinear element to be used for selecting the memory cell and controlling the current across the memory cell, hence ensuring the stableness of the memory actions on the target memory cell, including the program action, the erase action, and the read action, when the memory cells are arranged in a matrix to develop a memory cell array.

According to the non-volatile semiconductor memory device of the fourth feature, since the diode has a current rectifying property, the leak current specific to a cross-point type memory cell array can be decreased and the stableness of the memory actions can be ensured, when the memory cells are arranged in a cross-point type memory cell array. In particular, even if the memory cell is arranged to flow its current in one direction, its variable resistive element is capable of conducting the mono-polar switching action thus ensuring the program action and the erase action.

DETAILED DESCRIPTION OF THE INVENTION

A non-volatile semiconductor memory device according to the present invention (thus referred to as an inventive device hereinafter) and a method of controlling the resistance in a variable resistive element in the inventive device (referred to as an inventive method hereinafter) will be described referring to the relevant drawings.

Figure 1:
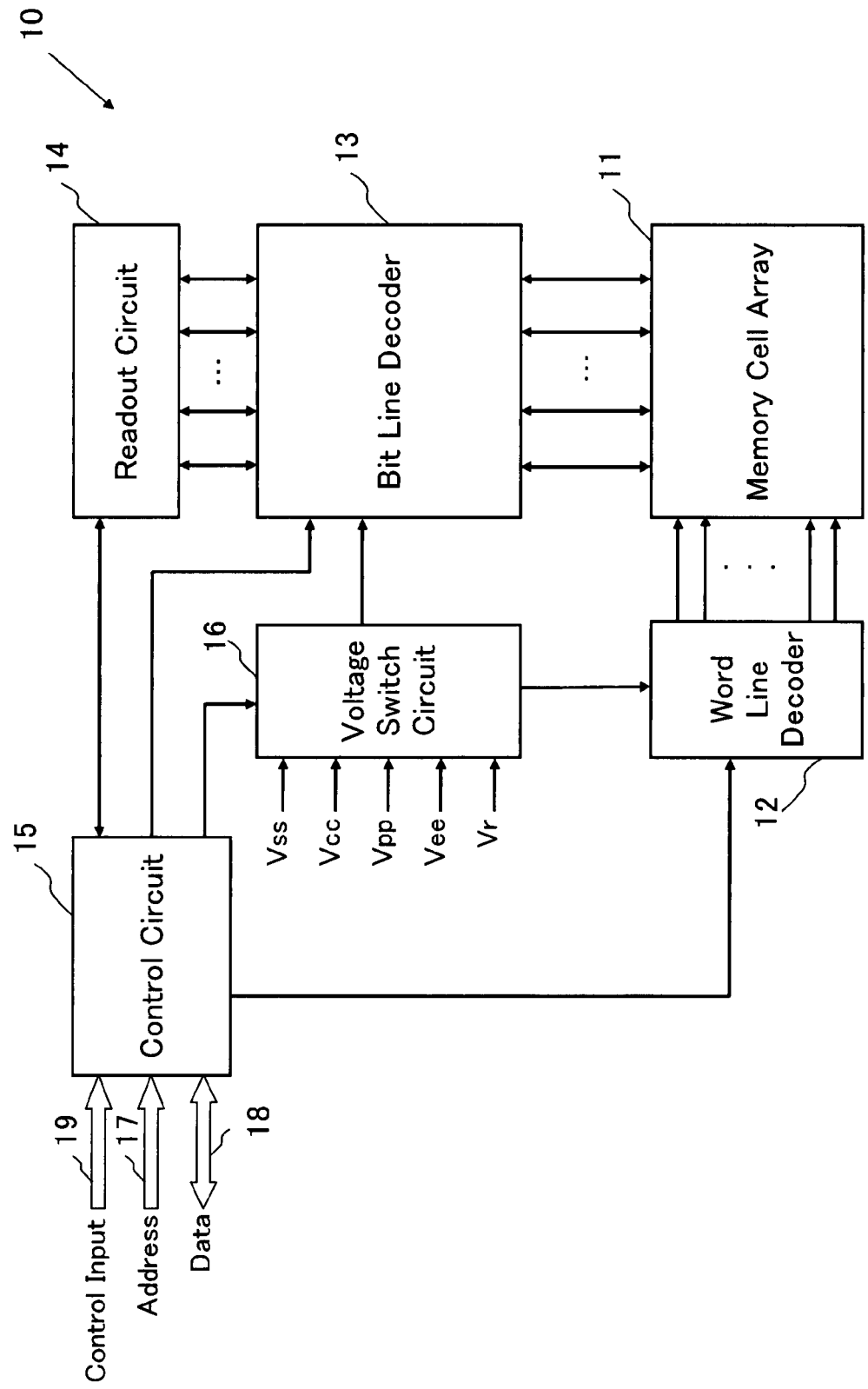
FIG. 1 is a block diagram schematically showing a circuitry arrangement of a non-volatile semiconductor memory device according to one embodiment of the present invention.

FIG. 1 illustrates a block diagram of one embodiment of the inventive device 10. As shown in FIG. 1, the inventive device 10 comprises an array of memory cells 11, a word line decoder 12, a bit line decoder 13, a readout circuit 14, a control circuit 15, and a voltage switch circuit 16.

The memory cell array 11 includes a number of non-volatile memory cells arranged in rows and columns, each memory cell determined by an address input from the outside is electrically programmed with a data. The data can be readout from the memory cell determined by the address input. More particularly, in response to an address signal received from an address line 17, the data is saved in the assigned memory cell in the memory cell array 11 and output via a data line 18 to an external apparatus.

In more detail, the memory cell array 11 has a cross-point type memory cell array structure in which the memory cells are of a two-port type, including a variable resistive element for saving a data through modifying the electric resistance, and are arranged in rows and columns and connected to word lines which extend along the rows and bit lines which extend along the columns, each row of the memory cells are connected at one end to a common word line and each column of the memory cells are connected at the other end to a common bit line. The memory cell in this embodiment may be arranged of which the variable resistive element is varied in the electric resistance when an electrical stress (a program voltage pulse and a erase voltage pulse) is applied at both ends for writing (or programming and erasing) the data.

The word line decoder 12 is provided for selecting the word lines in the memory cell array 11 as a selected word line in response to an address signal received from the address line 17 for selection of rows and applying a selected word line voltage and an unselected word line voltage to the selected word lines and the unselected word lines respectively for starting the program, erase, or readout action.

The word line decoder 12 is also provided for selecting the word lines during a forming action for applying a forming voltage pulse in order to shift the variable resistive element in each memory cell in the memory cell array 11 from the initial state after the production to the variable resistance state capable of the mono-polar switching action.

The bit line decoder 13 is provided for selecting the bit lines in the memory cell array 11 as a selected bit line in response to an address signal received from the address line 17 for selection of columns and applying a selected bit line voltage and an unselected bit line voltage to the selected bit lines and the unselected bit lines respectively for starting the program, erase, or readout action.

The bit line decoder 13 is also operated for selecting the bit lines during the forming action for shifting the variable resistive element in each memory cell in the memory cell array 11 from the initial state after the production to the variable resistance state capable of the mono-polar switching action.

The control circuit 15 is provided for controlling the program, erase, and readout action as well as the forming action of the memory cell array 11. The control circuit 15 is responsive to the address signal received from the address line 17, a data input received from the data line 18 (during the program or write action), and a control input signal received from a control signal line 19 for controlling the action of the word line decoder 12 and the bit line decoder 13 to conduct the readout, program, and erase action as well as the forming action of the memory cell array 11. The control circuit 15 also includes common functions as an address buffer circuit, a data input/output buffer circuit, and a control input buffer circuit though not shown in FIG. 1. The forming action is conducted in a test mode as will be explained later.

The voltage switch circuit 16 is provided for supplying the word line decoder 12 and the bit line decoder 13 with the selected word line voltage, the unselected word line voltage, the selected bit line voltage, and the unselected bit line voltage for conducting the readout, program, erase action as well as the forming action of the memory cell array 11. Denoted by Vcc, Vss, Vee, Vpp, and Vr are a supply (source) voltage, a grounding voltage, an erase voltage, a program voltage, and a readout voltage respectively in the inventive device 10.

The action of reading a data is progressed from the memory cell array 11 to the bit line decoder 13 and the readout circuit 18. The readout circuit 18 is provided for examining the state of data and transferring its result to the control circuit 15 before releasing to the data line 18.

Figure 2:
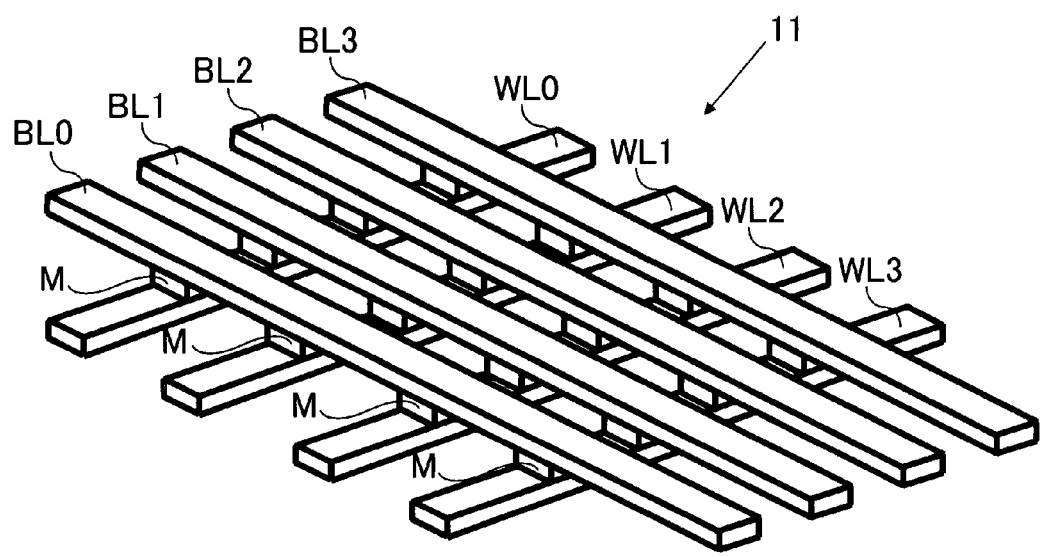
FIG. 2 is a perspective view schematically showing a part of the memory cell array of a cross-point type.
Figure 3:
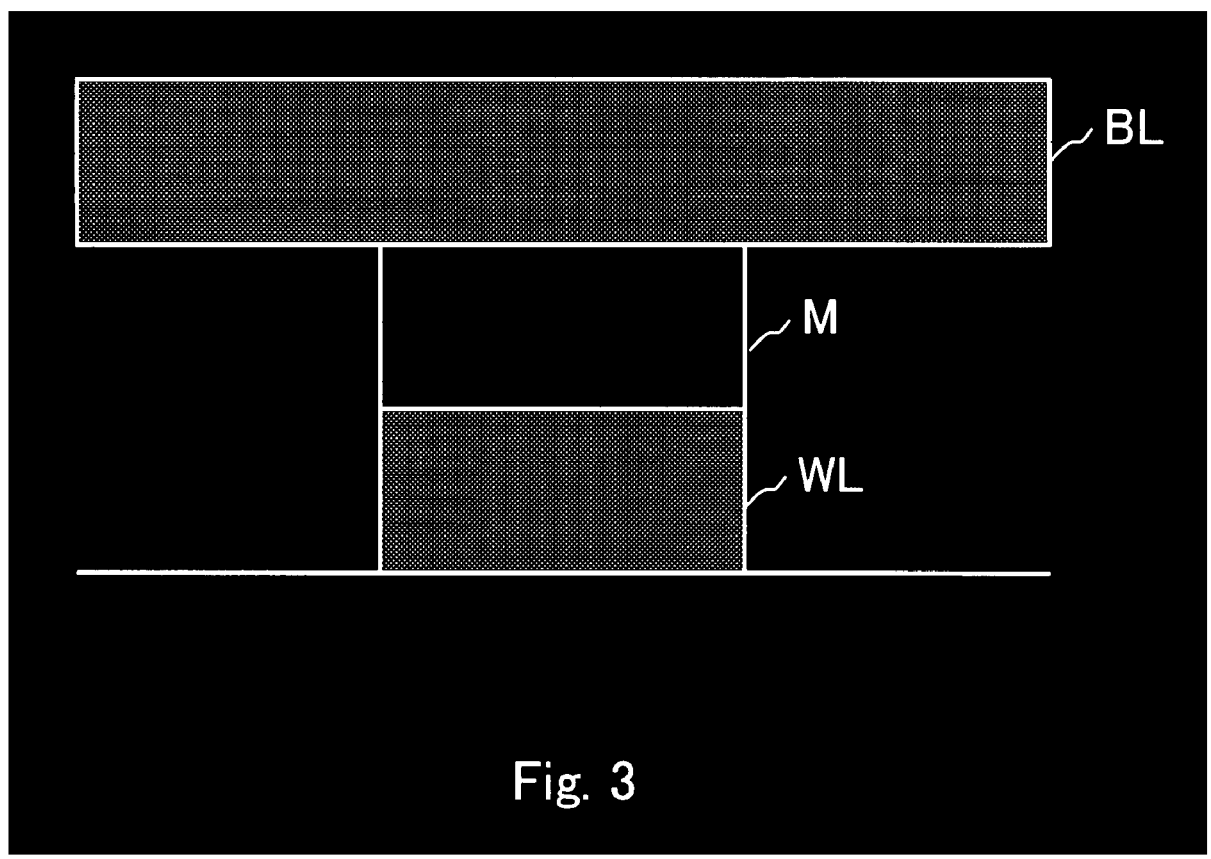
FIG. 3 is a vertically cross sectional view showing a memory cell of the two-port structure type in the cross-point type memory cell array shown in FIG. 2.
Figure 4B:
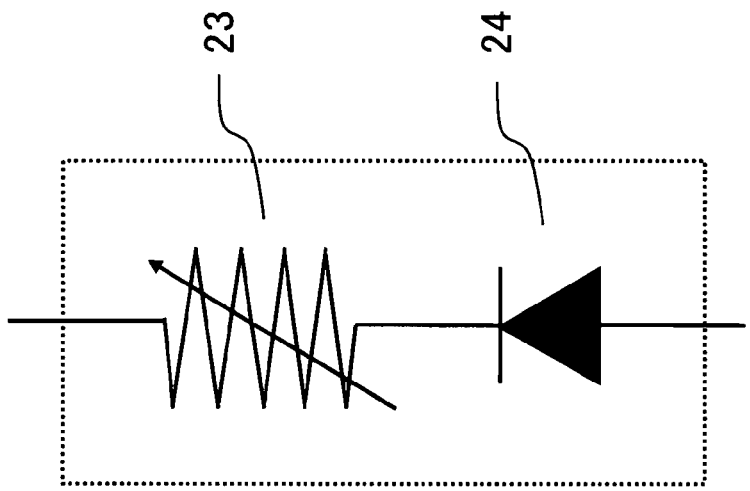
FIG. 4 illustrates a vertically cross sectional view and an equivalent circuitry diagram of another memory cell of the two-port structure type in the cross-point memory cell array shown in FIG. 2.
Figure 4A:
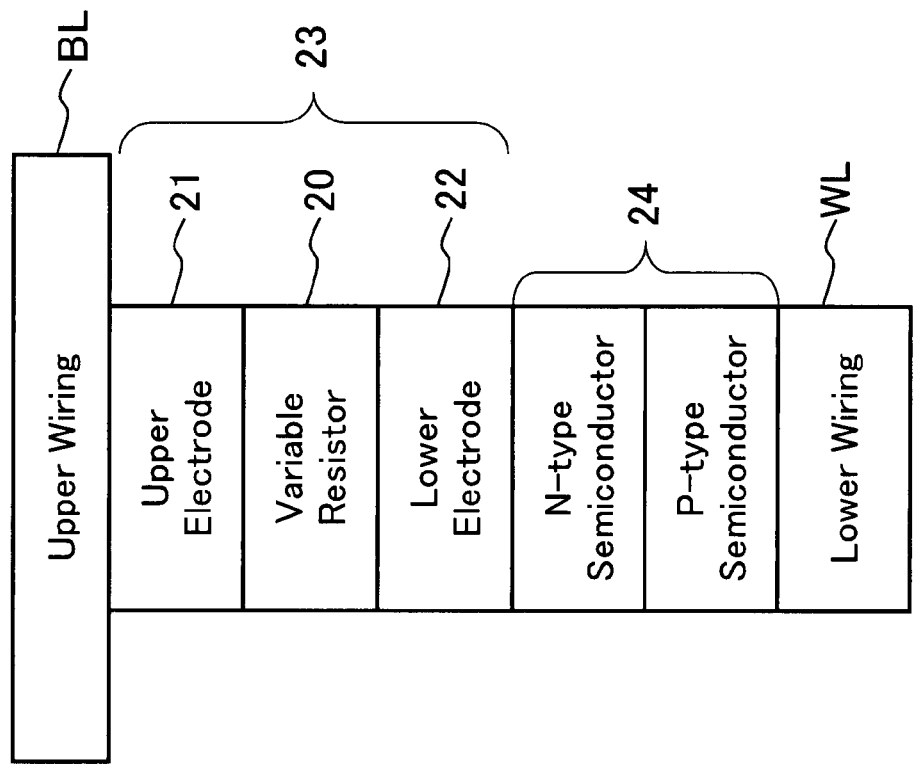

FIG. 2 schematically illustrates a portion of the memory cell array 11 of the cross-point type. As shown in FIG. 2, the memory cells M in the memory cell array 11 are located at the intersection between the four bit lines BL0 to BL3 and the four word lines WL0 to WL3. FIG. 3 is a cross sectional view of the memory cell taken along the vertical line in parallel to the direction of the bit line BL. The memory cell M may be of any applicable type having a variable resistive element of the two-port structure, which includes a variable resistor 20 made of a transition metal oxide such as PCMO, NiO, or TiO of which the resistance is varied by an electrical stress, as depicted in Citations 1 and 3. The arrangement shown in FIG. 3 has the variable resistor 20 sandwiched between the bit line BL and the word line WL which serve as the memory cell electrodes. The variable resistive element is arranged in a three layer structure where the variable resistor 20 is sandwiched between the two electrodes. Alternatively, the memory cell M may be implemented by a series circuit of the two-port structure in which a variable resistive element 23 having a variable resistor 20 of the transition metal oxide sandwiched between two electrodes 21 and 22 and a nonlinear element 24, such as a diode, having a nonlinear current and voltage characteristics are connected in series to each other, as shown in FIG. 4. Particularly when the nonlinear element 24 is a rectifying diode, it is highly compatible with the mono-polar switching action for conducting the write action and can favorably attenuate the leak current which derives from the cross-point structure of the memory cell array.

The switching characteristic of the variable resistive element in this embodiment will now be described in more detail. The switching characteristic means the relationship between the condition for applying the voltage pulse and the resistance state of the variable resistive element when the variable resistive element of the two-port structure is applied with the pulse voltage between the two ports in order to shift the electric resistive characteristic between two or more different levels which are set between the high resistance level and the low resistance level. It is assumed that the action of applying the voltage pulse of which the polarity is different between the shift from the high resistance level to the lower resistance level and the shift from the low resistance level to the high resistance level is called a bipolar switching action and the action of applying the voltage pulse of which the polarity is equal in both the shifts is called a mono-polar switching action. The following description is based on the variable resistive element of the three layer structure where the variable resistor made of PCMO is sandwiched between the two platinum (Pt) electrodes.

Figure 5:
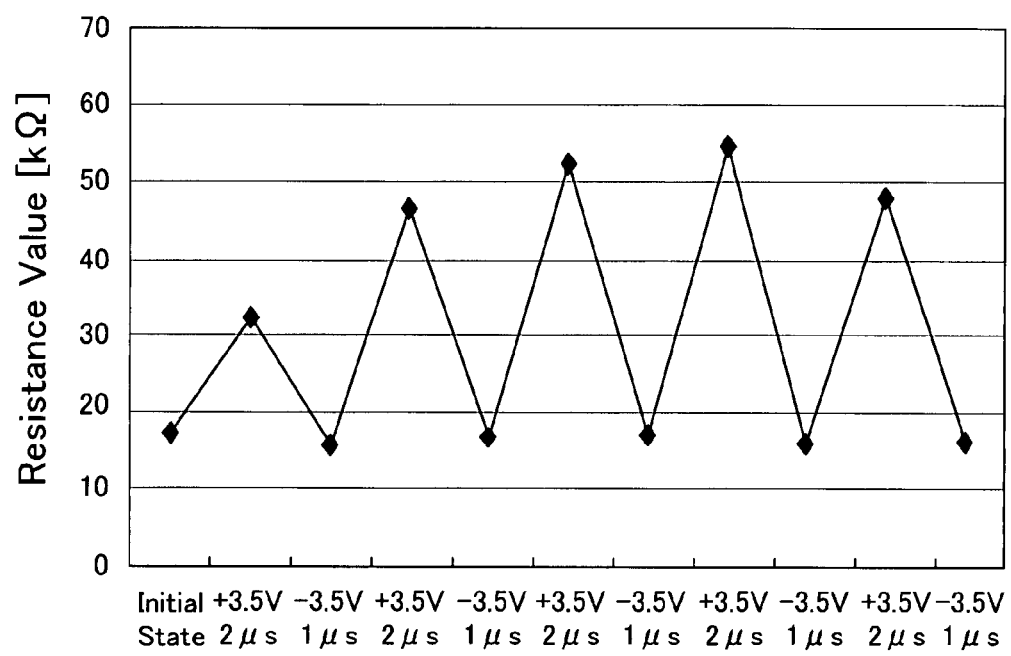
FIG. 5 is a switching characteristic of a bipolar switching action on a variable resistive element of a three-layer structure type which has a PCMO resistor sandwiched between two electrodes thereof.

FIG. 5 illustrates a profile of the switching characteristic when the bipolar switching action is conducted on the variable resistive element of the three layer structure. The condition for applying the program voltage pulse to shift the resistance state of the variable resistive element from the low resistance level to the high resistance level includes a voltage of +3.5 V and a pulse width of 2 µs (the time of pulse application). The condition for applying the erase voltage pulse to shift the resistance state of the variable resistive element from the high resistance level to the low resistance level includes a voltage of −3.5 V and a pulse width of 1 µs (the time of pulse application). As understood, the switching characteristic is consistent and stable.

The switching characteristic when the variable resistive element of the three layer structure is subjected to the mono-polar switching action will be described. The mono-polar switching action is triggered with two different voltage pulses which are equal in the polarity but different in the pulse width, a program voltage pulse for shifting the resistance state of the variable resistive element from the low resistance level to the high resistance level and an erase voltage pulse for shifting the same from the high resistance level to the low resistance level. In the mono-polar switching action of this embodiment, the resistance state of the variable resistive element in the initial state just after the end of the production is at the low resistance level, and the resistance state of the variable resistive element is shifted to the high resistance level when the program voltage pulse having a given pulse width is applied and returned back to the low resistance level when the erase voltage pulse which is equal in the polarity but longer in the pulse width than the program voltage pulse is applied.

The need for subjecting the variable resistive element at its initial state after the end of the production to the forming action will now be explained in order to make the mono-polar switching action stable.

Figure 6:
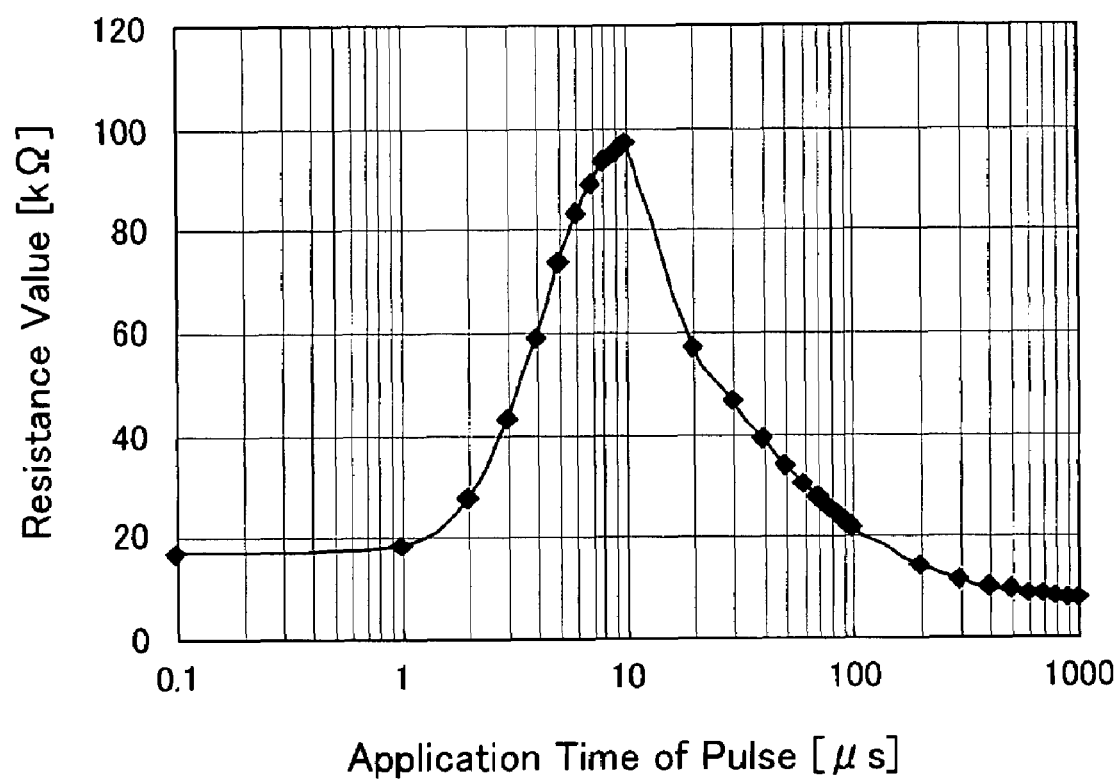
FIG. 6 is a resultant profile of the resistance of the variable resistive element in relation to the application time of a voltage pulse in which voltage pulses which are equal in the polarity are cumulatively applied to the variable resistive element at the initial state after the production.

FIG. 6 illustrates a resultant relationship between the resistance in the variable resistive element and the application time of the voltage pulse when a series of the voltage pulses which are at +3.5 V and equal in the polarity are applied in a succession. As shown in FIG. 6, the resistance of the variable resistive element at the initial state is increased to a peak value (the maximum) about 10 µs of the application time of the voltage pulse. The resistance is then declined as the application time of the voltage pulse progresses further. It is hence necessary for using the variable resistive characteristic at the initial state shown in FIG. 6 for the mono-polar switching action to set the pulse width of the program voltage pulse close to the application time of the voltage pulse where the resistance of the variable resistive element is peaked (about the critical point where the resistance change is reversed) and also the pulse width of the erase voltage pulse close to the application time of the voltage pulse where the resistance of the variable resistive element returns back to its initial level. The mono-polar switching action can thus be carried out by applying the variable resistive element with the program voltage pulse and the erase voltage pulse alternately.

Figure 7:
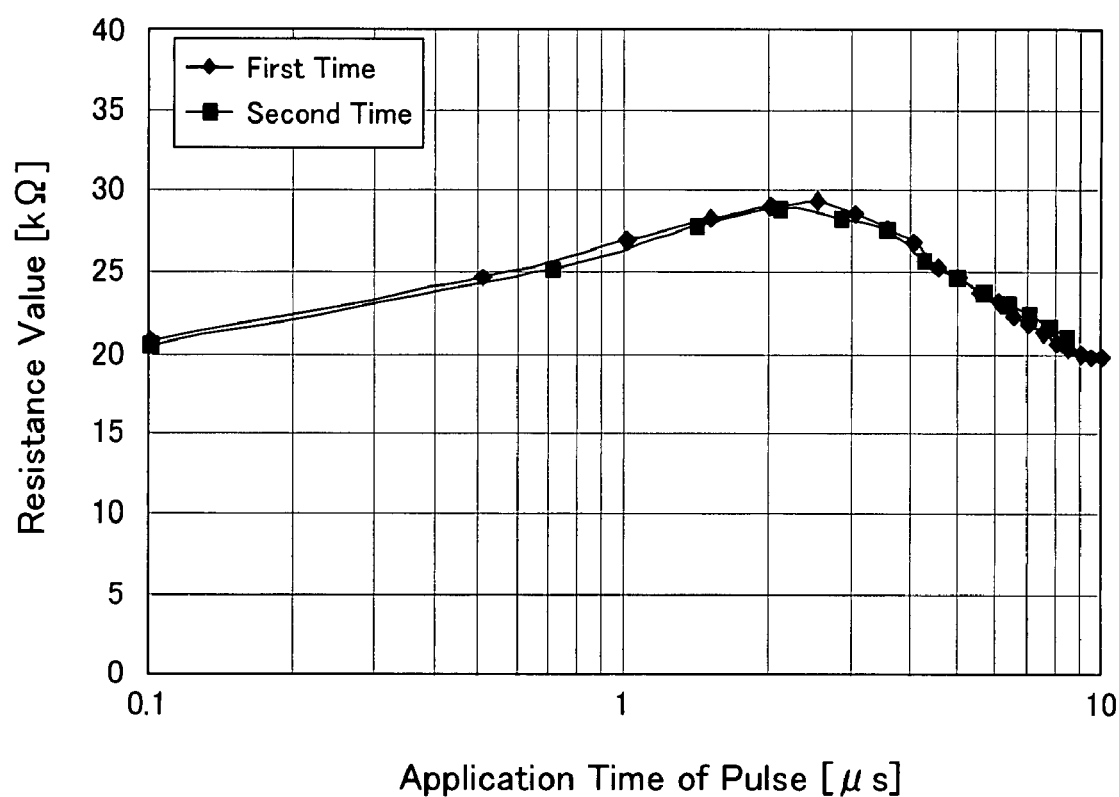
FIG. 7 is a resultant profile of the resistance of the variable resistive element in relation to the application time of a voltage pulse in which voltage pulses which are equal in the polarity are additionally and cumulatively applied to the variable resistive element showing the variable resistive characteristic at the initial state shown in FIG. 6.

FIG. 7 illustrates a resultant relationship between the application time of the voltage pulse and the resistance of the variable resistive element when the variable resistive element showing the variable resistive characteristic at the initial state shown in FIG. 6 has been applied with the voltage pulse of +4 V without changing the polarity two times repeatedly. It is apparent from FIG. 7 that the variable resistive characteristic of the variable resistive element is not equal before and after the application of the voltage pulse shown in FIG. 6 to the variable resistive element at the initial state. More particularly, the critical point where the resistance is peaked becomes earlier (from 10 µs to 3 µs) and its peak value becomes lower. FIG. 7 indicates that the critical point and the peak value are not significantly different between the first time and the second time of the application of the voltage pulse. Also, FIG. 7 indicates that the application time of the voltage pulse required for returning back to the low resistance level before the application of the voltage pulse is close to the critical point of the variable resistive characteristic at the initial state shown in FIG. 6. In other words, since the variable resistive characteristic of the variable resistive element at the initial state shown in FIG. 6 is significantly different from the variable resistive characteristic returned back to the low resistance state after the application of the voltage pulse shown in FIG. 7, the variable resistive characteristic at the initial state on its own may not be used for the mono-polar switching action. Moreover, the variable resistive characteristic shown in FIG. 7 allows the resistance to be varied by the application of the voltage pulse at a shorter pulse width, as compared with the variable resistive characteristic at the initial state shown in FIG. 6, whereby the pulse width of the program voltage pulse can be shortened.

It is hence favorable for using the variable resistive characteristic shown in FIG. 7 for the mono-polar switching action to set the pulse width of the program voltage pulse to about 3 µs at the critical point where the resistance of the variable resistive element is peaked and also the pulse width of the erase voltage pulse to about 10 µs of the application time of the voltage pulse where the resistance of the variable resistive element returns back to its low resistance level. Therefore, the forming action for shifting the variable resistive characteristic of the variable resistive element at the initial state shown in FIG. 6 to the mono-polar switching characteristic shown in FIG. 7 has to involve the application of a forming voltage pulse, which is identical in the polarity to the program voltage pulse and the erase voltage pulse, throughout the duration exceeding the critical point of the variable resistive characteristic at the initial state shown in FIG. 6.

Figure 8:
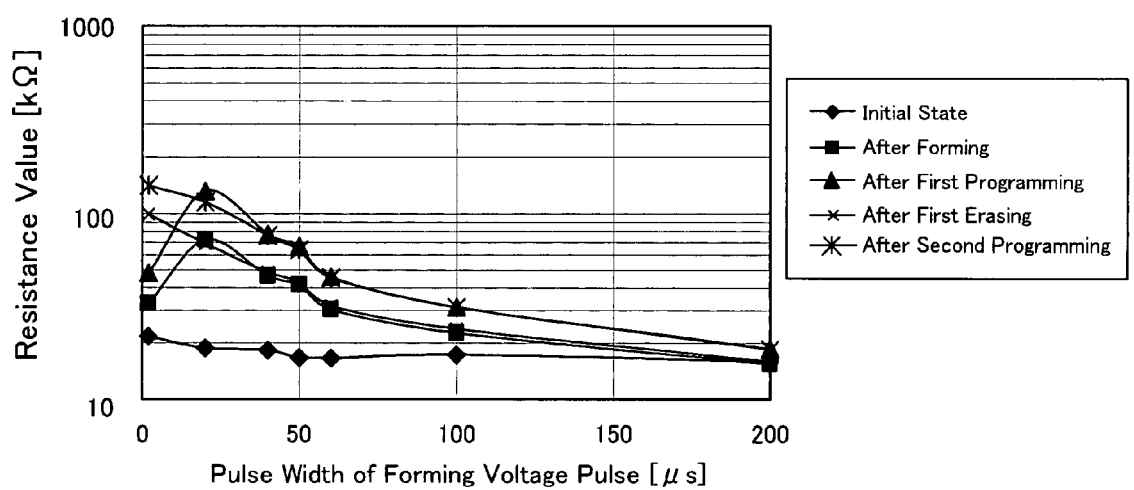
FIG. 8 is a graphic profile showing a relationship between the application time of a forming voltage pulse and the mono-polar switching characteristic.
Figure 9:
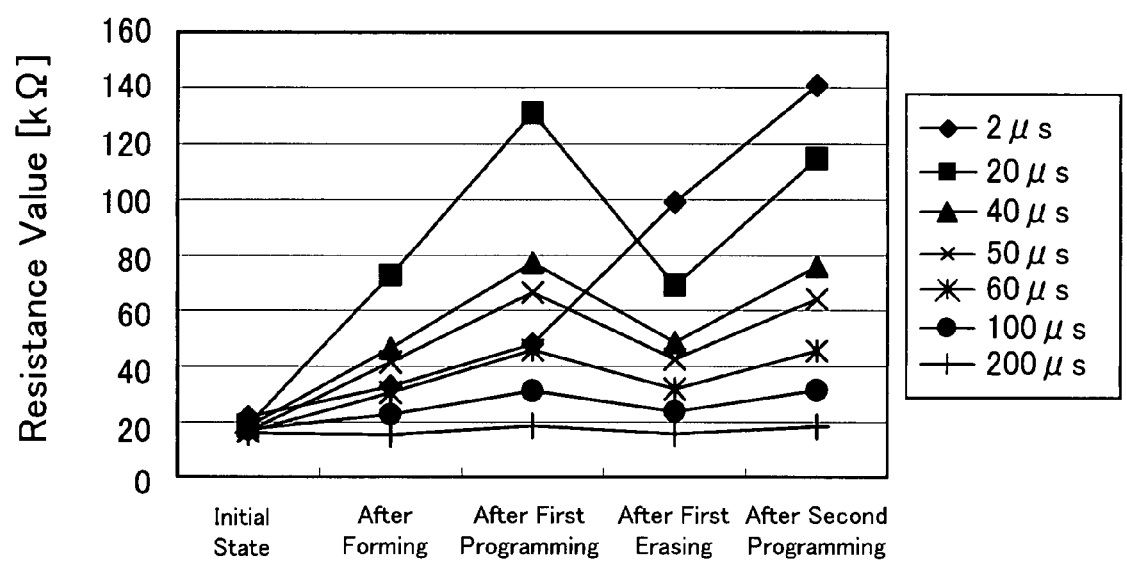
FIG. 9 is a graphic profile showing a relationship between the application time of the forming voltage pulse and the mono-polar switching characteristic.

FIGS. 8 and 9 illustrate resultant relationships between the pulse width of the forming voltage pulse (the application time) used in the forming action and the mono-polar switching characteristic after the forming action. In FIG. 8, the horizontal axis represents the pulse width of the forming voltage pulse and the vertical axis represents measurements of the resistance of the variable resistive element at the initial state, after the forming action, after the first time of the program action, after the first time of the erase action, and after the second time of the program action. FIG. 9 illustrates the measurements of the resistance of the variable resistive element shown in FIG. 8 using the pulse width of the forming voltage pulse as a parameter, where the vertical axis represents the resistance and the horizontal axis represents each state at the initial state, after the forming action, after the first time of the program action, after the first time of the erase action, and after the second time of the program action. More specifically, the measurements shown in FIGS. 8 and 9 result from the forming voltage pulse at 3.5 V with seven different pulse widths of 2 µs, 20 µs, 40 µs, 50 µs, 60 µs, 100 µs, and 200

μs, the program voltage pulse at 4 V with a pulse width of 300 μs, and the erase voltage pulse at 3.5 V with a pulse width of 3 μs.

As apparent from FIGS. 8 and 9, the resistance after the forming action is equal to the resistance after the first time of the erase action, except the case of the application of the forming voltage pulse with the pulse width of 2 μs. Also, the resistance after the forming action becomes higher as the pulse width of the forming voltage pulse is decreased, except the application of the forming voltage pulse with the pulse width of 2 μs. It is proved that the mono-polar switching characteristic becomes stable after the forming action and that the resistance of the variable resistive element at the low resistance state in the mono-polar switching characteristic is determined by the resistance after the forming action which is controllably optimized with the pulse width of the forming voltage pulse. When the pulse width of the forming voltage pulse is 2 μs in FIGS. 8 and 9, the resistance after the forming action is not equal to the resistance after the first time of the erase action by the fact that forming action with the forming voltage pulse at 2 μs of the pulse width has not completely been finished. More particularly, the forming action has not been completed since the resistance remains increasing at the second time of the program action. This may result from the critical point of the variable resistive characteristic at the initial state shown in FIG. 6 remaining substantially at 10 μs.

Figure 10:
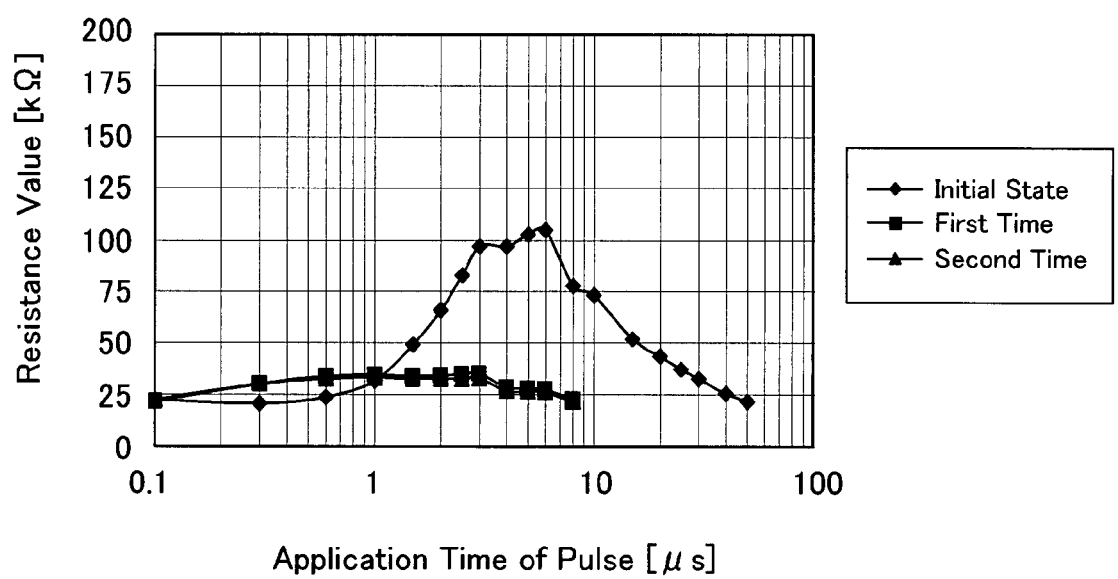
FIG. 10 is a graphic profile showing a relationship between the application time of the forming voltage pulse and the mono-polar switching characteristic.
Figure 11:
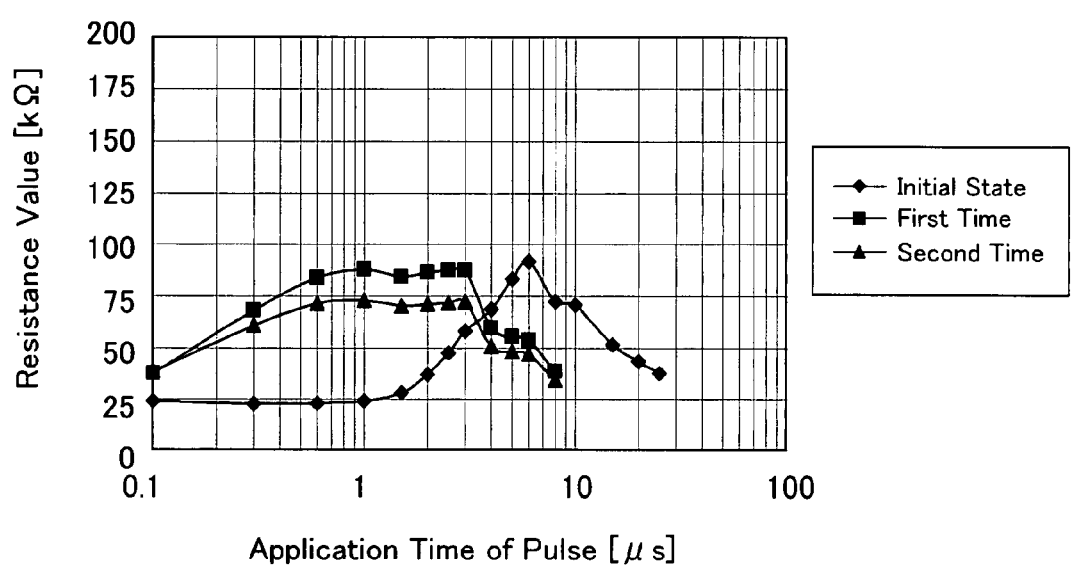
FIG. 11 is a graphic profile showing a relationship between the application time of the forming voltage pulse and the mono-polar switching characteristic.
Figure 12:
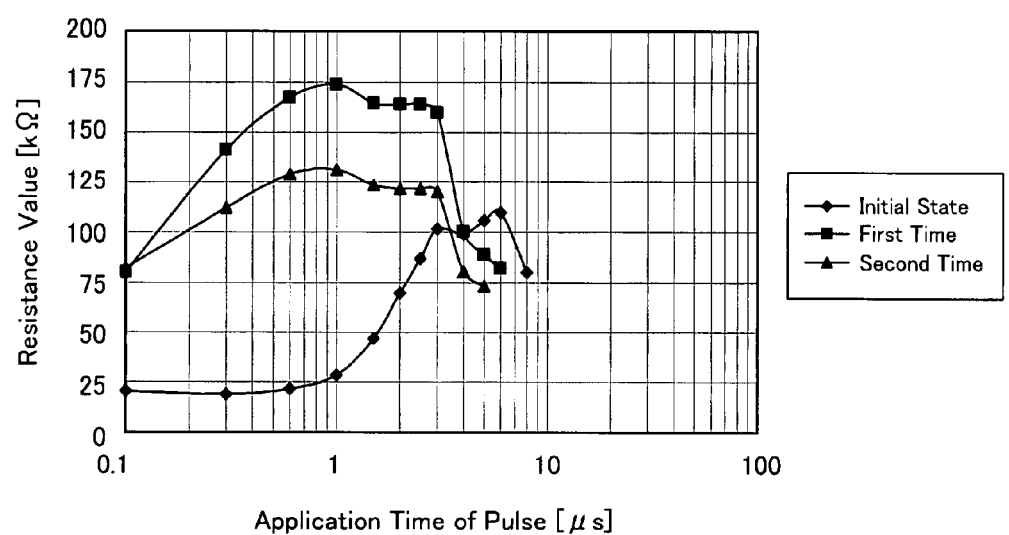
FIG. 12 is a graphic profile showing a relationship between the application time of the forming voltage pulse and the mono-polar switching characteristic.

FIGS. 10 to 12 illustrate relationships between the pulse width of the forming voltage pulse and the mono-polar switching characteristic after the forming action. FIGS. 10 to 12 illustrate the variable resistive characteristic during the forming action and the variable resistive characteristic (the mono-polar switching characteristic) in the case of application of a series of the voltage pulses after the forming action. FIG. 10 shows that the forming action is finished after 50 μs of the application time of the forming voltage pulse. FIG. 11 shows that the forming action is finished after 15 μs of the application time of the forming voltage pulse. FIG. 12 shows that the forming action is finished after 8 μs of the application time of the forming voltage pulse. While the forming voltage pulse and the erase voltage pulse are at 3.5 V as lower by 0.5 V than 4 V of the program voltage pulse in FIGS. 8 and 9, all the three voltage pulses are set to 4 V in FIGS. 10 to 12. Accordingly, the effect of the pulse width of the forming voltage pulse can accurately be examined regardless of any difference between the applied voltage levels.

It is hence apparent from the relationships shown in FIGS. 10 to 12 that the resistance after the forming action is matched with the resistance after the first time of the erase action and becomes higher as the pulse width of the forming voltage pulse is decreased. As the result, the mono-polar switching characteristic can be made stable by the forming action. In addition, the resistance of the variable resistive element at the low resistance level in the mono-polar switching action can be determined by the resistance after the forming action which is controllably optimized with the pulse width of the forming voltage pulse.

As understood from the relationships shown in FIGS. 8 to 12, the resistance ratio between the low resistance level and the high resistance level will hardly be increased when the pulse width of the forming voltage pulse is too long. It is hence mandatory that the pulse width is set to as a small as possible to prevent the resistance after the forming action from returning back to its level at the initial state after the production.

Figure 13:
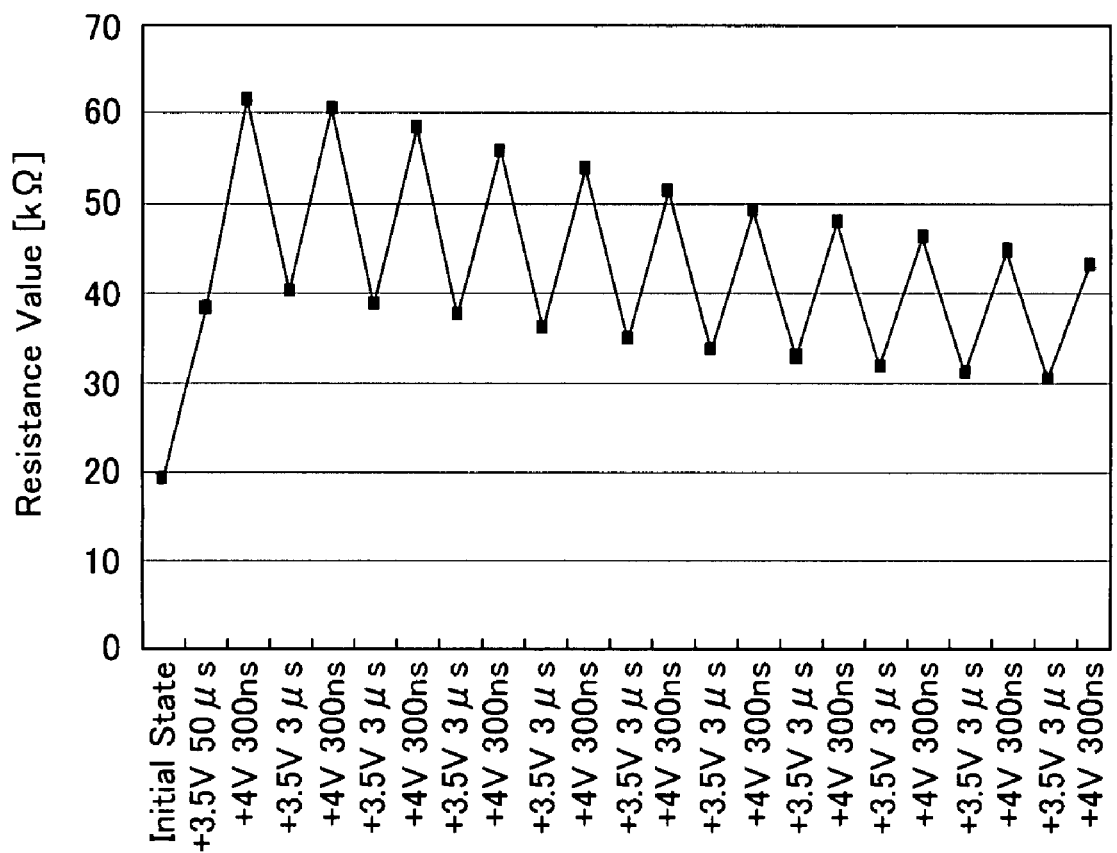
FIG. 13 is a graphic profile showing the mono-polar switching action at stableness after a forming action in the method of controlling the resistance of the variable resistive element according to the present invention.

FIG. 13 illustrates a result of the mono-polar switching characteristic when the program action and erase action has been repeated with the program voltage pulse of 4 V at the pulse width of 300 ns and the erase voltage pulse of 3.5 V at the pulse width of 3 μs after the forming action with the forming voltage pulse of 3.5 V at the pulse width of 50 μs. It is apparent from FIG. 13 that the mono-polar switching action becomes stable after the forming action with the use of an optimum of the forming voltage pulse.

Figure 14:
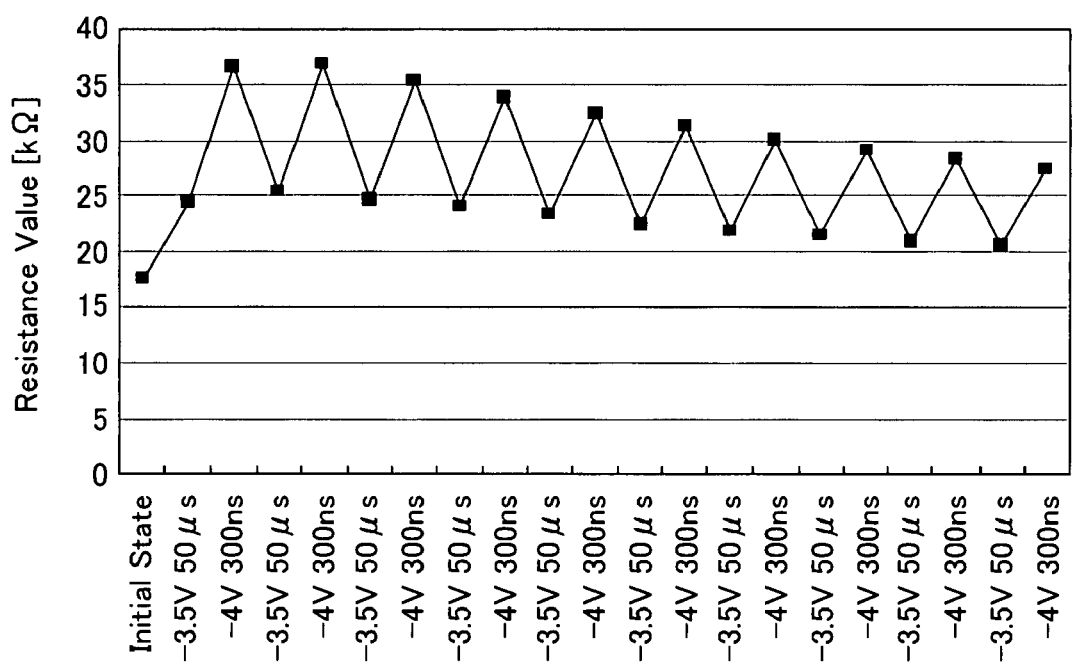
FIG. 14 is a graphic profile showing the mono-polar switching action at stableness after the forming action in the method of controlling the resistance of the variable resistive element according to the present invention.

Similarly, FIG. 14 illustrates a result of the mono-polar switching characteristic when the program and erase action has been repeated with the program voltage pulse of −4 V at the pulse width of 300 ns and the erase voltage pulse of −3.5 V at the pulse width of 3 μs after the forming action with the forming voltage pulse of −3.5 V at the pulse width of 50 μs. It is apparent from FIG. 14 that the mono-polar switching action becomes stable after the forming action with the use of an optimum of the forming voltage pulse if the voltage pulses are equal in the polarity, even when they are negative.

Figure 15:
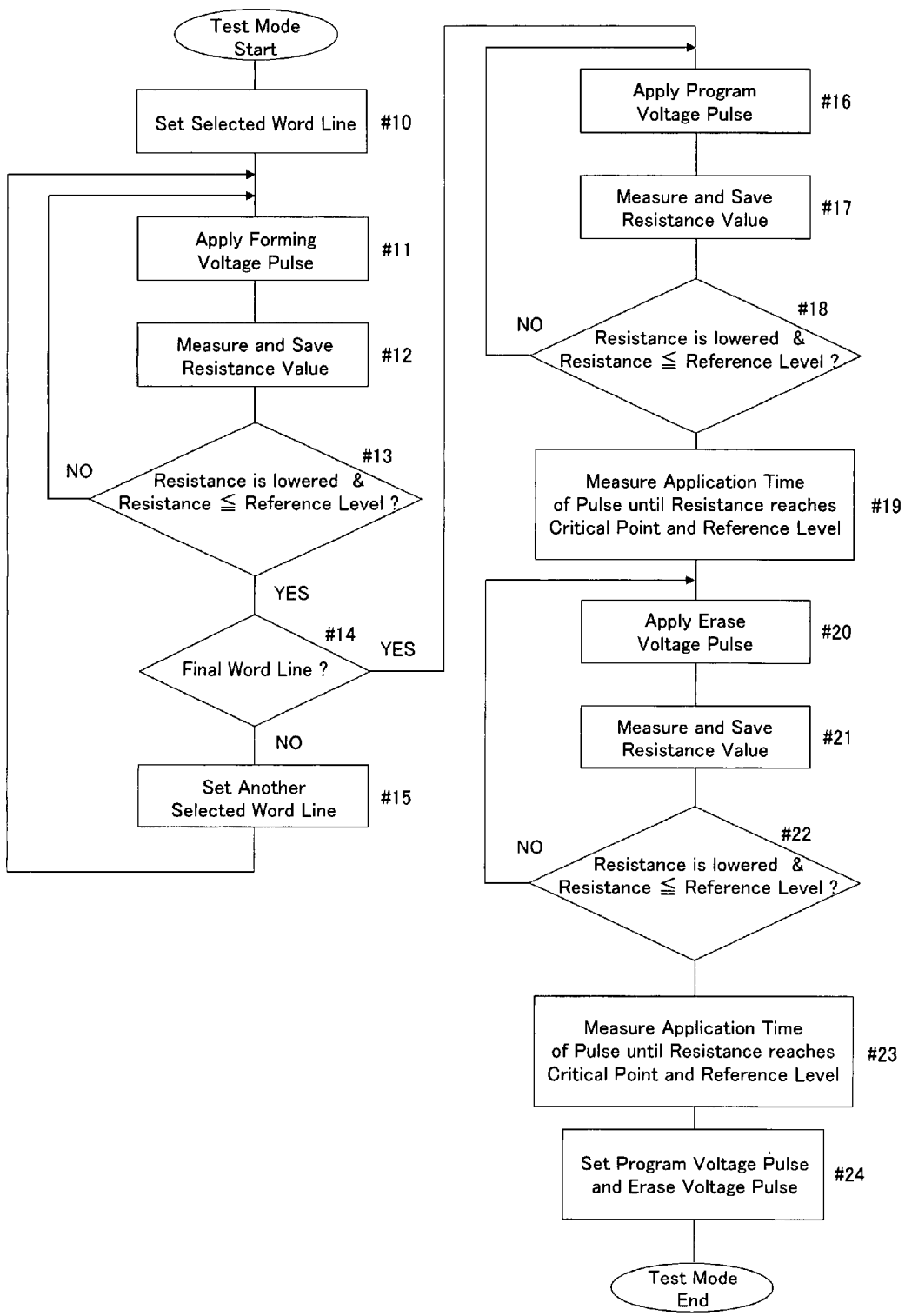
FIG. 15 is a flowchart showing a procedure of the forming action in the method of controlling the resistance of the variable resistive element according to the present invention.

A procedure of the forming action over the variable resistive element which has the variable resistive characteristic at the initial state shown in FIG. 6 will now be explained referring to the flowchart of FIG. 15. The target of the forming action is the variable resistive element in each memory cell in the memory cell array 11 shown in FIG. 1. It is also assumed that all the memory cells connected to one or more word lines in the memory cell array 11 are selectively subjected to the forming action and the control circuit 15 in the inventive device 10 is then controlled by an external memory tester for carrying out the forming action in a test mode. The forming action is conducted on the basis of each one or group of the word lines but not each memory cell because the other memory cells not to be subjected to the forming action should remain not affected by an accidental and improper forming action. The forming voltage pulse is applied to the selected word lines with all the bit lines in the memory cell array 11 connected to the grounding voltage Vss. The unselected word lines remain at the grounding voltage Vss. This allows the selected memory cells to be applied with the forming voltage pulse while the other unselected memory cells remain applied with no voltage and do not receive the effect of any improper forming action.

The procedure starts with selecting one or more of the word lines to be subjected to the forming action of the first time (Step #10). Then, the forming voltage pulse is applied at a desired pulse width (for example, 100 ns) (Step #11) and the resistance of the variable resistive element at each application of the forming voltage pulse is measured and saved in the tester (Step #12). It is then examined at the tester whether or not the resistance of the variable resistive element is declined lower than the level at the preceding application of the forming voltage pulse and whether or not the resistance of the variable resistive element reaches a reference level for determining the low resistance level in the mono-polar switching characteristic (Step #13). When there are memory cells where the forming action has not been completed, that is, the resistance of the variable resistive element measured at Step #12 is not declined lower than the level at the preceding application of the forming voltage pulse or higher than the reference level, the application of the forming voltage pulse at Step #11 is continued over the memory cells, while the application is canceled over the memory cells where the forming action has been completed, that is, where the resistance of the variable resistive element measured at Step #12 is declined lower than the level at the preceding application of the forming voltage pulse and lower than the reference level. When Step #13 judges that the resistance of the variable resistive element measured at Step #12 is declined lower than the level at the preceding application of the forming voltage pulse in all the memory cells connected to the selected word line, the pulse width of the forming voltage pulse is increased from its initial value to, for example, 1 μs. When the resistance of the variable resistive element measured at Step #12 is declined lower than the level at the preceding application of the forming voltage pulse in all the memory cells connected to the selected word line and remains lower than the reference level or the forming action has been completed, it is then examine whether or not the selected word line is the last word line in the forming action (Step #14). When the selected word line is not the last word in the forming action, it is regarded as the unselected word line and the next word line is selected (Step #15) and the procedure returns back to Step #11. When Step #14 judges that the selected word line is the last word line in the forming action, it is judged that the forming action over the memory cell array 11 has been completed and the procedure is terminated.

Then, the program voltage pulse is applied at a desired pulse width (for example, 100 ns) to both the fastest and latest memory cells where the resistance is modified by the forming action (Step #16) and the resistance of the variable resistive element at each application of the program voltage pulse is measured and saved in the tester (Step #17). It is then examined at the tester whether or not the resistance of the variable resistive element is declined lower than the level at the preceding application of the program voltage pulse and whether or not the resistance of the variable resistive element reaches a reference level for determining the low resistance level in the mono-polar switching characteristic (Step #18). The two steps #16 and #17 are repeated until the resistance in the memory cell selected at Step #16 reaches the reference level. Then, the application time of the voltage pulse is measured until the resistance reaches the reference point and the critical point for the mono-polar switching characteristic after the forming action (Step #19). Equally, the erase voltage pulse is applied at a desired pulse width (for example, 100 ns) (Step #20) and the resistance of the variable resistive element at each application of the erase voltage pulse is measured and saved in the tester (Step #21). It is then examined at the tester whether or not the resistance of the variable resistive element is declined lower than the level at the preceding application of the erase voltage pulse and whether or not the resistance of the variable resistive element reaches a reference level for determining the low resistance level in the mono-polar switching characteristic (Step #22). The two steps #20 and #21 are repeated until the resistance in the memory cell selected at Step #20 reaches the reference level. Then, the application time of the voltage pulse is measured until the resistance reaches the reference point and the critical point for the mono-polar switching characteristic after the forming action (Step #23). With reference to the measurements of the duration until the resistance reaches the reference level and the critical point, the pulse width of the program voltage pulse is set close to the critical point (for example, the minimum or the average) determined at Step #17 and the pulse width of the erase voltage pulse is set close to the application time of the voltage pulse (for example, the maximum or the average) determined at Step #21 until the resistance reaches the reference level. The settings of the pulse width are then saved in the control circuit 15 and the test mode is terminated (Step #24).

Accordingly, when the forming action described above has been completed over all the memory cells in the memory cell array 11, the memory cells become capable of the mono-polar switching action which starts from the low resistance level.

In case that the memory cells in the memory cell array 11 are substantially uniform in the variable resistive characteristic, the above described steps may be carried out over one selected word line to examine the pulse width of the forming voltage pulse required for reaching the reference level of the resistance. Simultaneously, the other word lines may be subjected to a single action of application of the forming voltage pulse at the same pulse width before the forming action is finished. Alternatively, the measurement of the application time of the voltage pulse until the resistance reaches the reference level and the critical point for determining the mono-polar switching characteristic after the forming action can be conducted with test memory cells in order to determine both the pulse width of the program voltage pulse and the pulse width of the erase voltage pulse.

Next, the condition for application of a memory action voltage to each memory cell in the cross-point type memory cell array which has been subjected to the forming action will be described in the form of a 4×4 matrix of the memory cell array. For ease of the description, the selected memory cell to be subjected to the memory action is denoted by M22.

Figure 16:
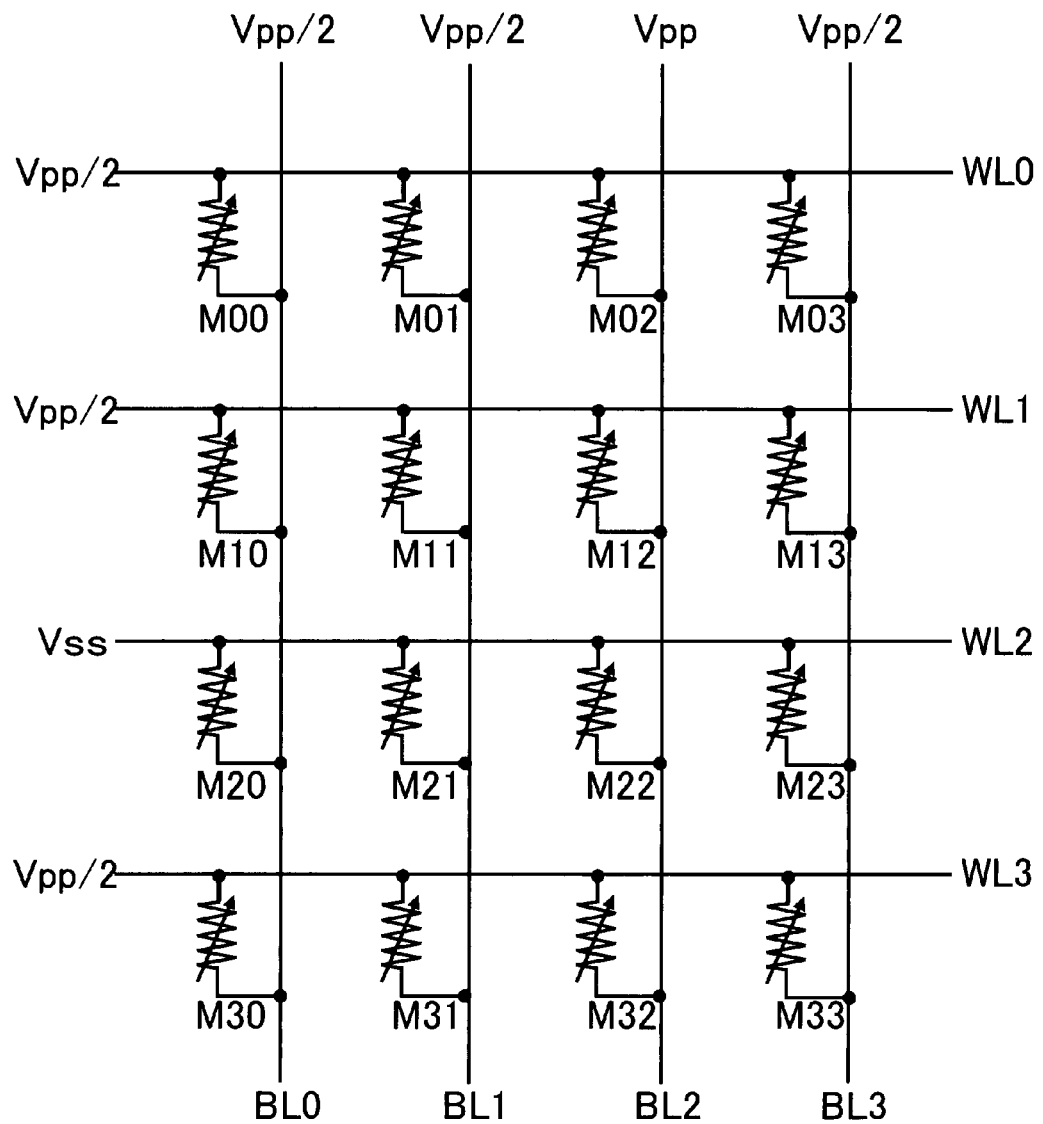
FIG. 16 is an equivalent circuitry diagram showing a condition for application of voltage in the cross-point type memory cell array of a 4×4 matrix to carry out the program action.

The condition for application of the voltage for the program action involves, as shown in FIG. 16, the selected bit line BL2 applied with a program voltage Vpp, the unselected bit lines BL0, BL1, and BL3 applied with a program inhibit voltage Vpp/2 which is equal to a half the program voltage Vpp, the selected word line WL2 connected to the grounding voltage Vss, and the unselected word lines WL0, WL1, and WL3 applied with the program inhibit voltage Vpp/2. As the result, the program voltage Vpp is applied between two ends of the selected memory cell M22 while the program inhibit voltage Vpp/2 is applied to the unselected memory cells connected to the selected bit line BL2 and the selected word line WL2 (referred to simply as semi-unselected memory cells hereinafter). The other unselected memory cells (referred to as totally unselected memory cells hereinafter) remain applied with no voltages. The semi-unselected memory cells can be isolated from the program action when the lower limit of the program voltage (the absolute value) required for the program action is set higher than the program inhibit voltage Vpp/2 (the absolute). The application time of the program voltage Vpp to the selected memory cell M22 can controllably be determined by the pulse width of the program voltage determined after the forming action.

Figure 17:
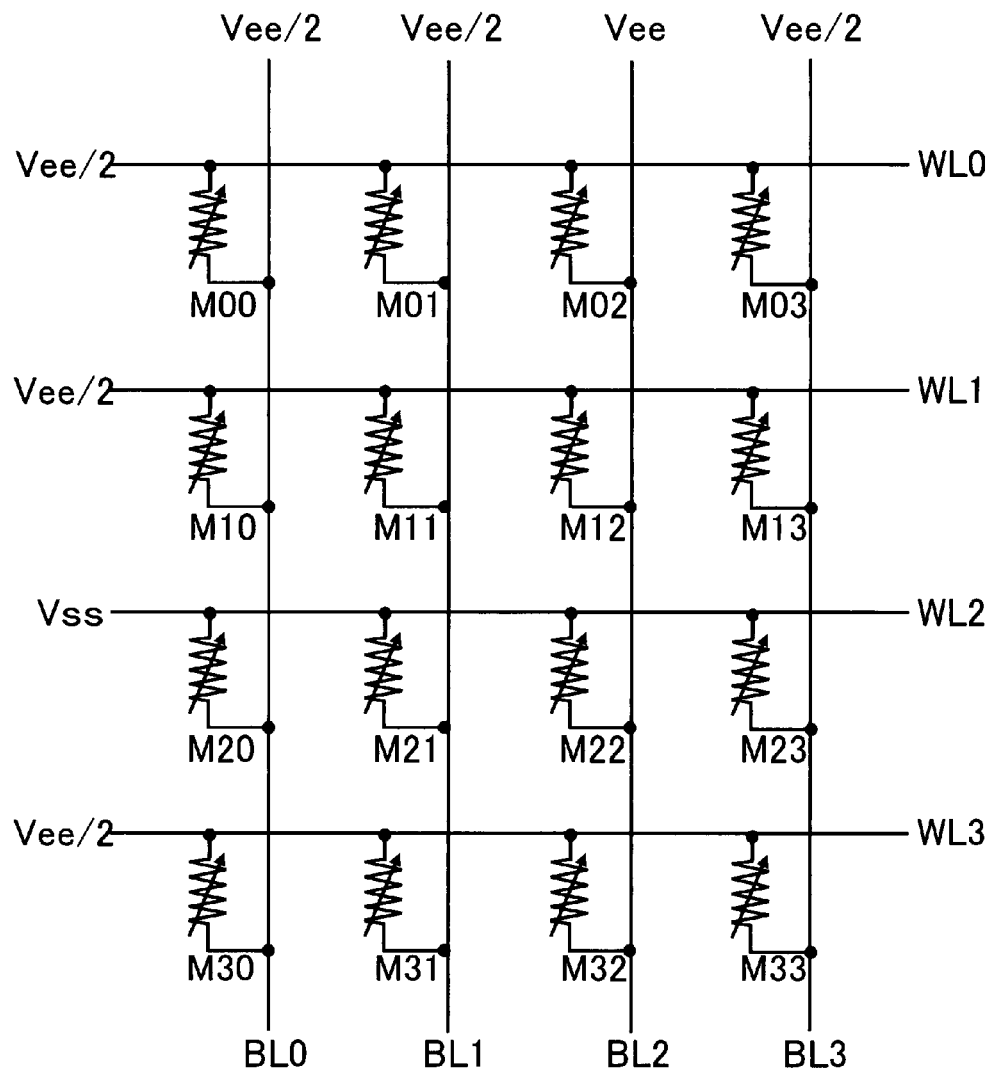
FIG. 17 is an equivalent circuitry diagram showing a condition for application of voltage in the cross-point type memory cell array of the 4×4 matrix to carry out the erase action.

The condition for application of the voltage for the erase action is identical to that for the program action as shown in FIG. 17, except that the program voltage Vpp is replaced by the erase voltage Vee, the program inhibit voltage Vpp/2 is replaced by an erase inhibit voltage Vee/2, and the application time of the erase voltage Vee to the selected memory cell M22 is determined by the pulse width of the erase voltage determined after the forming action which is longer than the application time of the program voltage Vpp.

Figure 18:
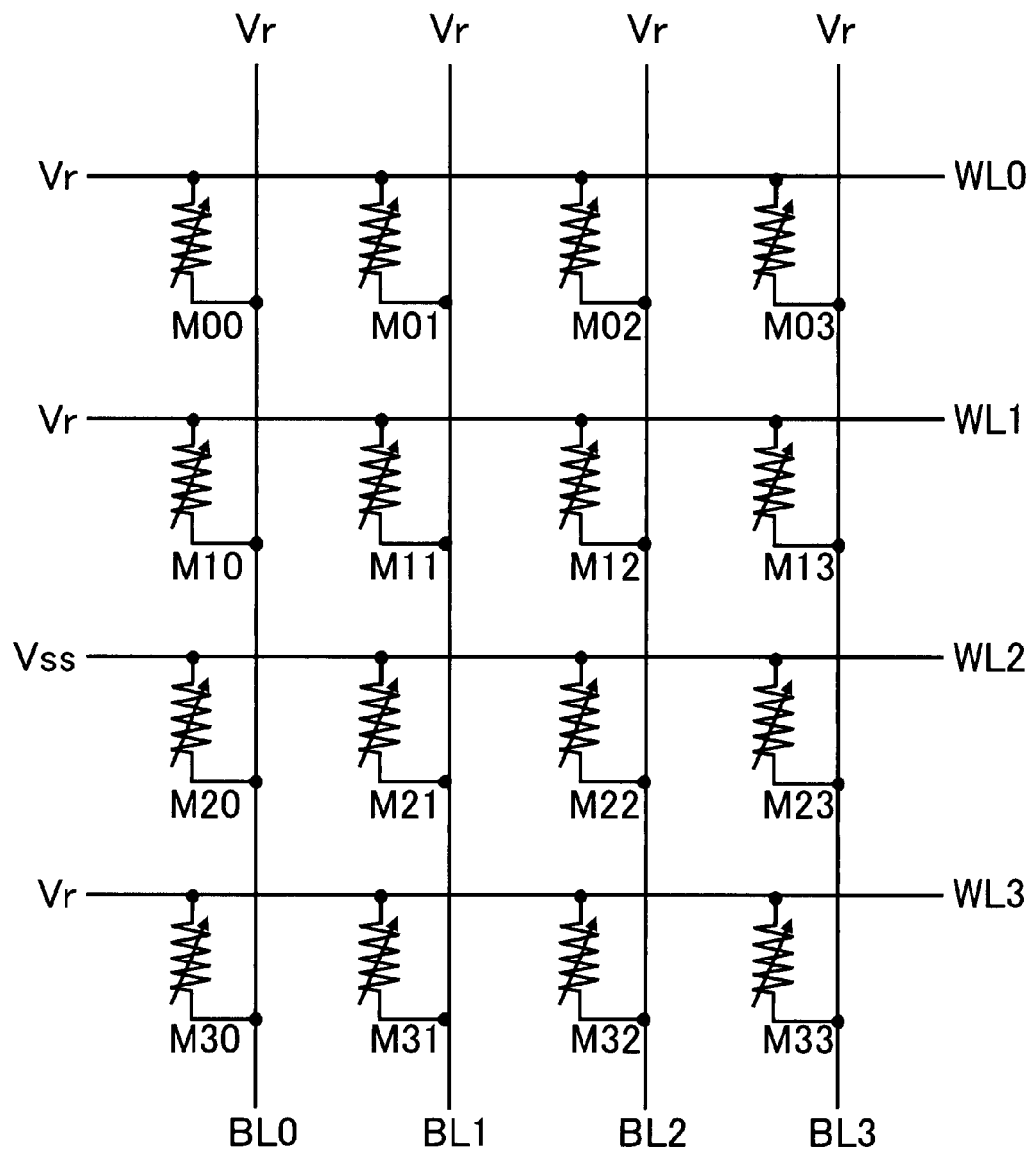
FIG. 18 is an equivalent circuitry diagram showing a condition for application of voltage in the cross-point type memory cell array of the 4×4 matrix to carry out the readout action.

The condition for application of the voltage in the readout action involves, as shown in FIG. 18, all the bit lines BL0 to BL3 applied with the readout voltage Vr, the selected word line WL2 connected with the grounding voltage Vss, and the unselected word lines WL0, WL1, and WL3 applied with the readout voltage Vr. Since the readout current corresponding to each memory cell connected to the selected word line WL2 flows into the bit lines BL0 to BL3 per word line, the data can be read out from the selected memory cell M22 by selectively detecting the readout current along the selected bit line BL2. While the readout voltage Vr is applied to the memory cells along the selected word line WL2, its (absolute) level is set lower than both the program inhibit voltage Vpp/2 and the erase inhibit voltage Vee/2 so as to trigger no unwanted program or erase action.

Other embodiments of the inventive device will be described.

(1) As described in detail with the foregoing embodiment, the variable resistive element of a three layer structure has a variable resistor of PCMO, which incorporates the variable resistive element in the memory cell, sandwiched between two platinum (Pt) electrodes. The variable resistive element may be made of any applicable material with the variable resistive characteristic of which the resistance, when voltage pulses at the same polarity are applied in a succession, is varied in one direction to reach the peak value (at maximum or minimum) and then return back to its initial level before the application of the voltage pulses for enabling the mono-polar switching action and of which the variable resistance characteristic is shifted before and after the forming action. Accordingly, the material of the variable resistive element is not limited to PCMO. The material of the electrodes is not limited to platinum. Moreover, the resistance of the variable resistive element at the initial state is not limited to the low resistance level but may be at the high resistance level.

(2) Although the foregoing embodiment assigns the program action to shifting of the resistance of the variable resistive element from the low resistance level to the high resistance level and the erase action to a reverse of the program action or shifting of the resistance of the variable resistive element from the high resistance level to the low resistance level, the program action and the erase action may be conducted in a reverse of their shifting action.

(3) While the foregoing embodiment allows the forming action to be carried out with both the program voltage pulse Vpp and the erase voltage pulse Vee set different from each other (See FIG. 15), the steps #20 to #23 in the procedure of the forming action may be eliminated when the program voltage pulse Vpp and the erase voltage pulse Vee are equal to each other.

Figure 19A:
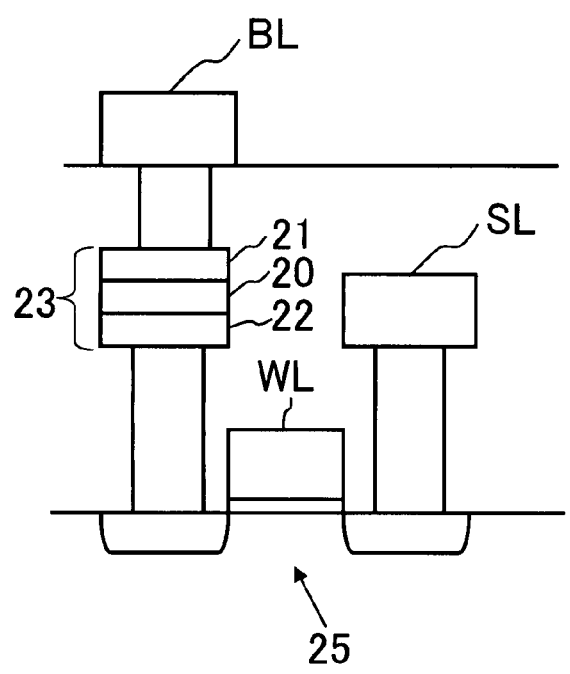
FIG. 19 illustrates a vertically cross sectional view and an equivalent circuitry diagram of a memory cell of a three-port structure type.
Figure 19B:
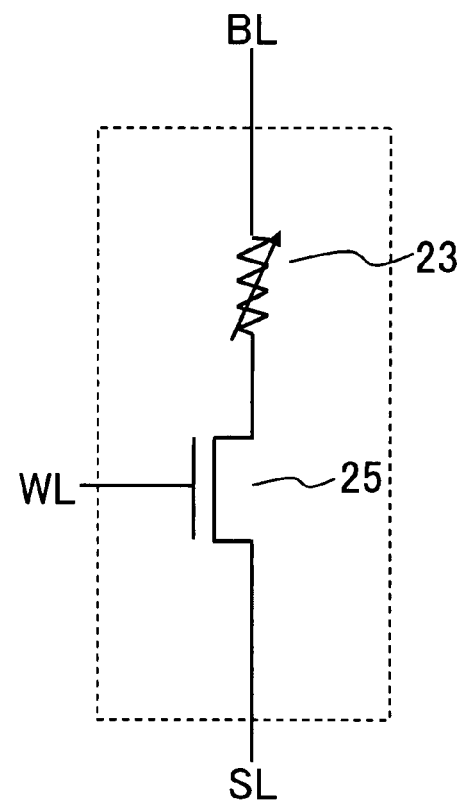

(4) Although its foregoing embodiment is implemented by the cross point structure of the memory cell array 11 having the two-port type memory cells, the inventive method may be applied to another arrangement of the memory cell array where the memory cells of a three-port type, each memory cell comprising a variable resistive element 23 and a selected transistor 25 (a form of nonlinear element) connected in a series as shown in FIG. 19, are arranged in row and columns. The memory cells on each row are connected at a gate of each selected transistor to a common word line WL, and the memory cells on each column are connected at one end of each series circuit of the variable resistive element and the selected transistor to a common bit line BL and at the other end of the same to a common source line SL.

Figure 20:
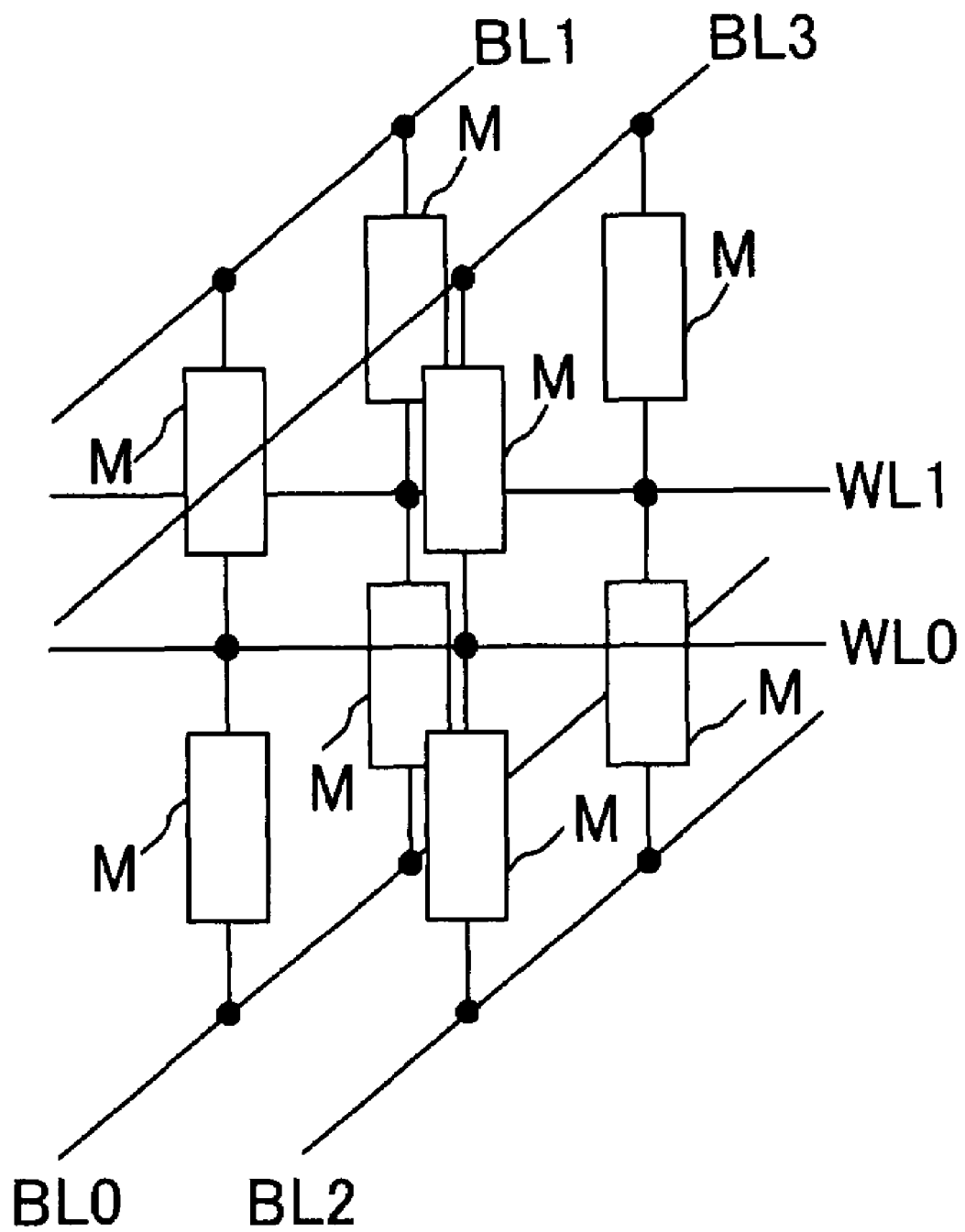
FIG. 20 is an equivalent circuitry diagram schematically showing a part of a cross-point type memory cell array of a three dimensional structure.
Figure 21:
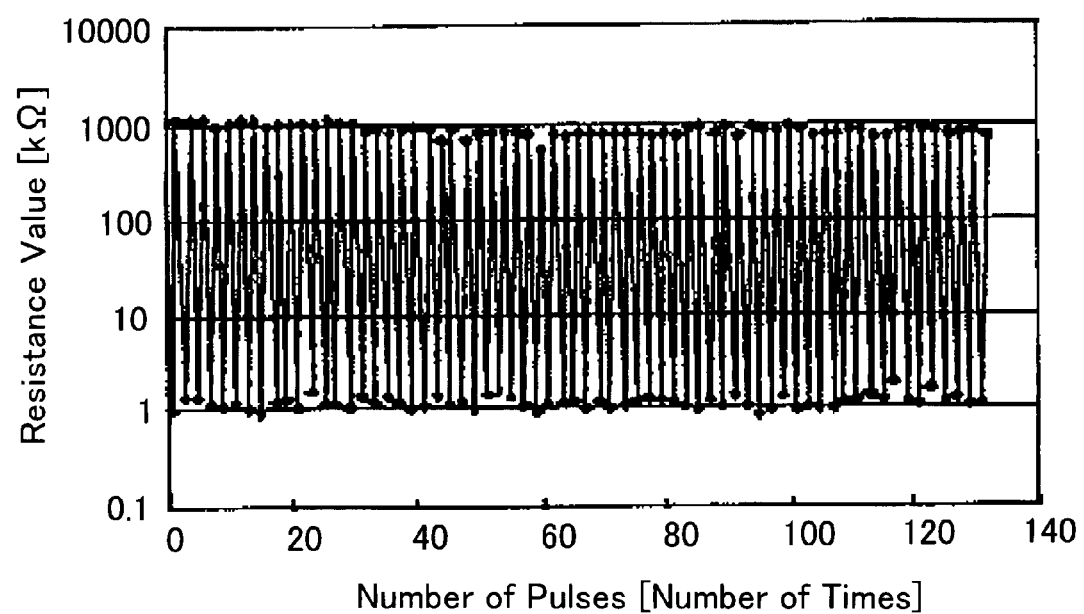
FIG. 21 is a graphic profile showing the switching characteristic of a conventional variable resistive element.
Figure 22:
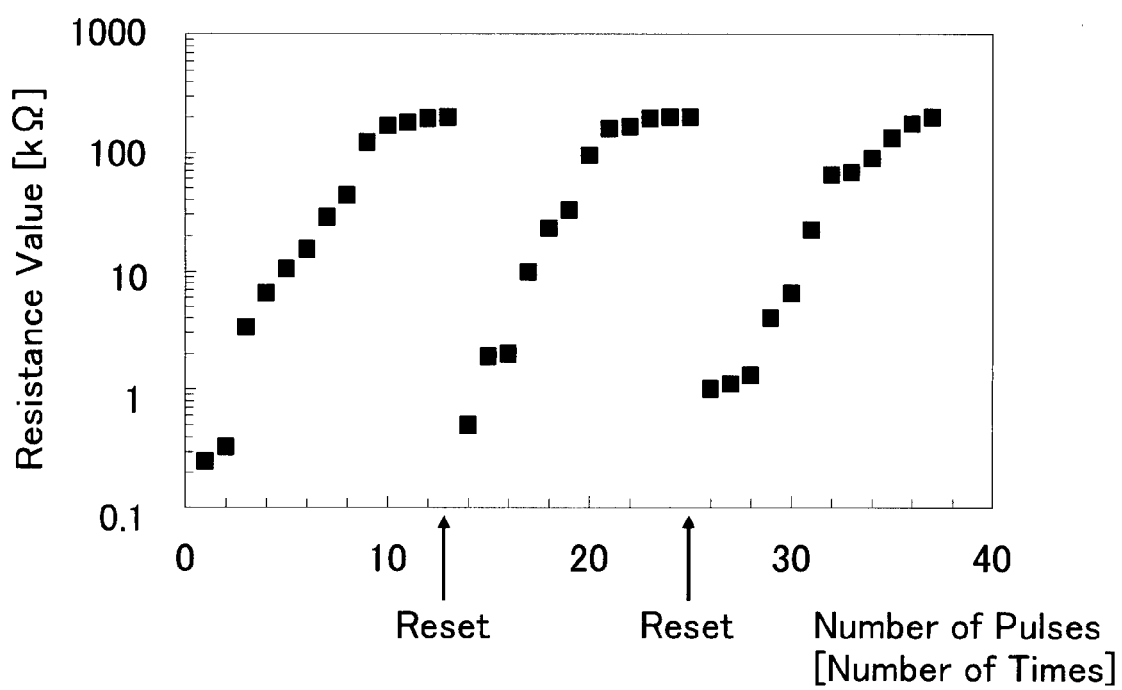
FIG. 22 is a graphic profile showing the switching characteristic of the conventional variable resistive element.
Figure 23:
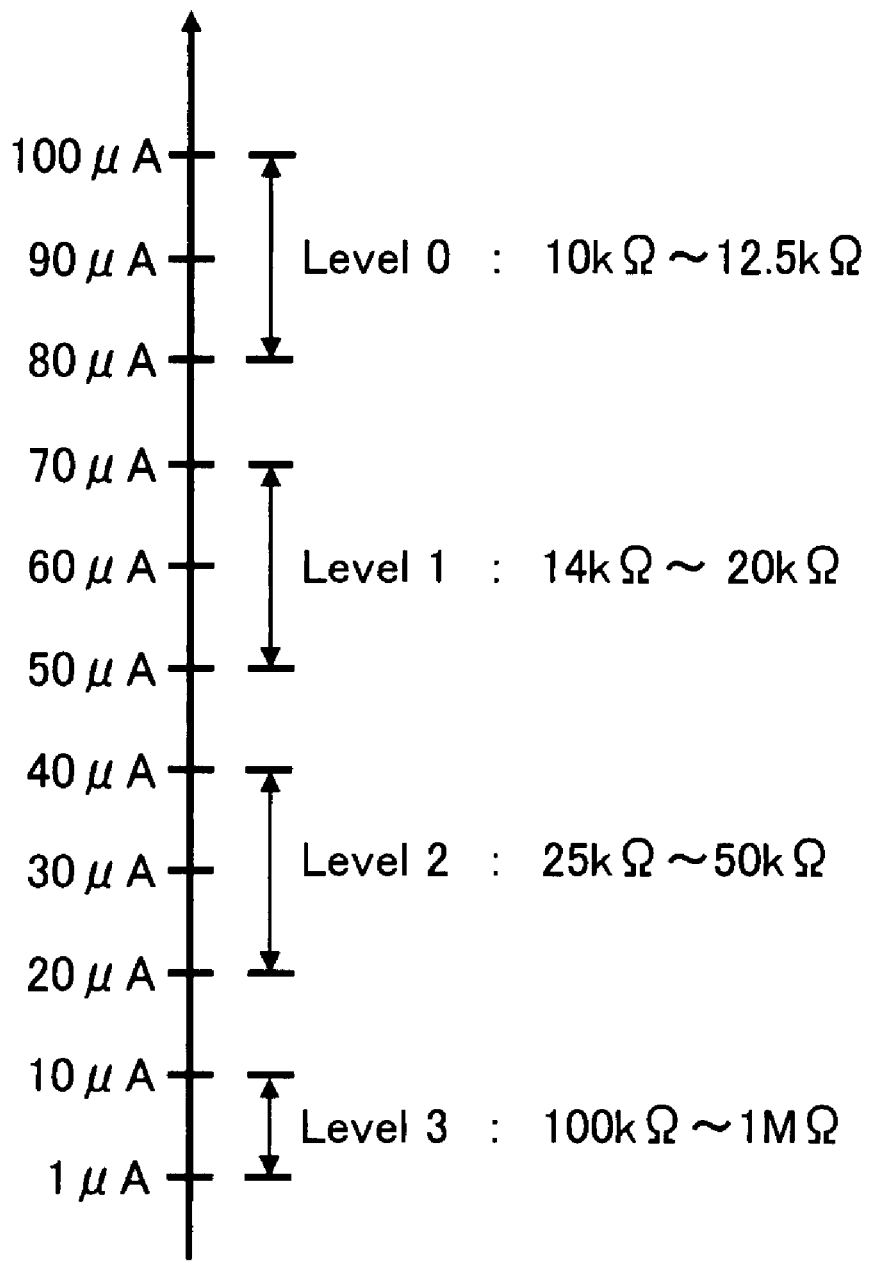
FIG. 23 is an explanatory view showing a range of multiple levels when the conventional variable resistive element is used in a multilevel memory.
Figure 24:
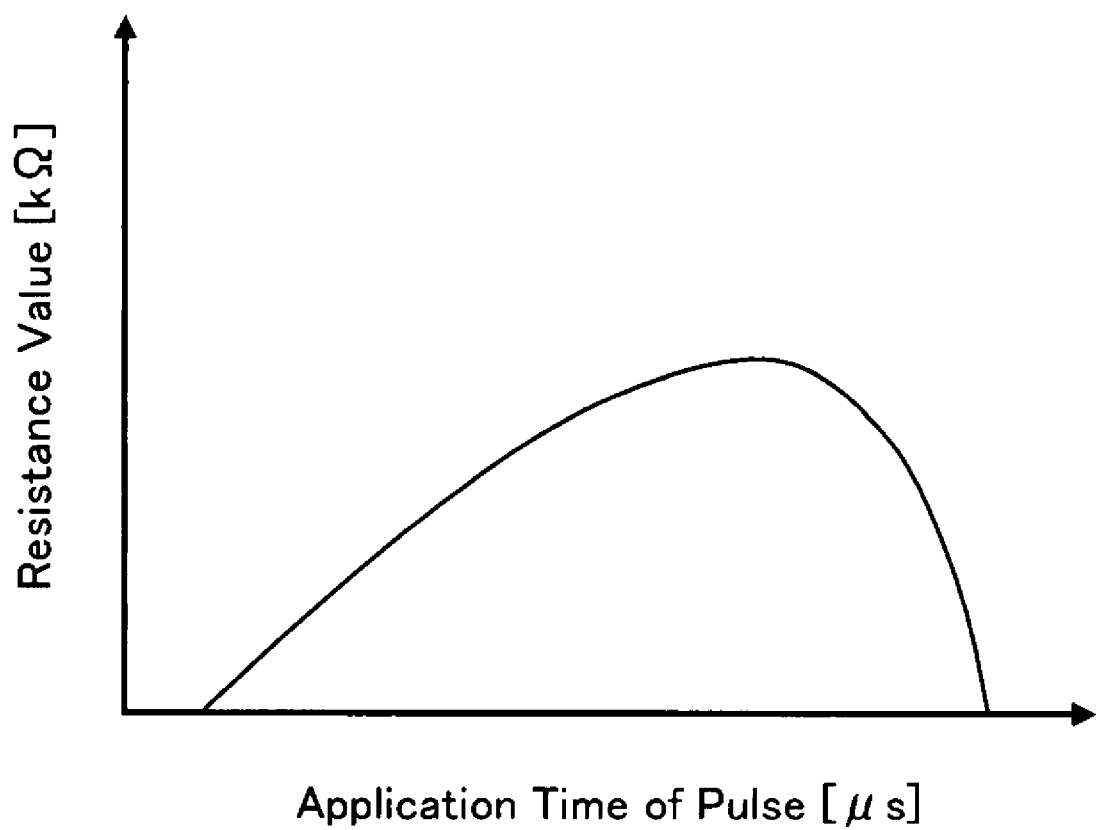
FIG. 24 is a graphic profile schematically showing the mono-polar switching characteristic of the conventional variable resistive element.

(5) Although the memory cell array 11 in the foregoing embodiment has a two dimensional structure where the memory cells are arranged in rows and columns, it may have a three dimensional structure where the memory cell arrays at the two dimensional arrangement are placed one over another in the vertical direction on the substrate as shown in FIG. 20.

(6) Although the forming action in the foregoing embodiment selects the memory cell to be subjected to the forming action on the basis of each word line and applies the selected word line with the forming voltage pulse, it may select the memory cell to be subjected to the forming action on the basis of each bit line and applies the selected bit line with the forming voltage pulse while the word lines are connected to the grounding voltage Vss.

(7) The condition for application of the voltages for conducting the forming action and the memory action described in the foregoing embodiment is simply illustrative of but not of limitations of the present invention and may thus be modified as desired.

The present invention is favorably applicable to a non-volatile semiconductor memory device and particularly to a non-volatile semiconductor memory device which includes an array of memory cells which are arranged in rows and columns, each memory cell having a variable resistive element capable of the mono-polar switching action, hence being advantageous for allowing the memory cell to conduct the mono-polar switching action at higher stability.

Although the present invention has been described in terms of the preferred embodiment, it will be appreciated that various modifications and alternations might be made by those skilled in the art without departing from the spirit and scope of the invention. The invention should therefore be measured in terms of the claims which follow.

What is claimed is:

1. A method of controlling a resistance of a variable resistive element having a two-port structure of which a resistive characteristic is varied by application of a voltage pulse to both ends, the method comprising:

a forming step of forming the variable resistive element so as to be a variable resistance state capable of a mono-polar switching action where a variable resistive characteristic of the variable resistive element is turned to a program resistive characteristic when a program voltage pulse is applied to the variable resistive element for first pulse application time and to an erase resistive characteristic when an erase voltage pulse equal in polarity to the program voltage pulse is applied to the variable resistive element for second pulse application time longer than the first pulse application time, wherein one or more forming voltage pulses equal in polarity to the program voltage pulse are applied to the variable resistive element for third pulse application time longer than the second pulse application time.

2. The method according to claim 1, wherein
the resistance of the variable resistive element after the forming step is controlled through modifying the third pulse application time.

3. The method according to claim 1, wherein
the variable resistive element is taking a first resistance varying state, a second resistance varying state, and a third resistance varying state in order as the pulse application time progresses in the forming step, wherein
the resistance is not largely varied from an initial resistance and remains substantially constant in a first resistance varying state, the resistance is varied towards a peak value in a second resistance varying state, and the resistance is varied in a reverse direction from the peak value to the initial resistance in a third resistance varying state.

4. The method according to claim 3, wherein
the forming voltage pulse is applied in the forming step at least until the variable resistive element is shifted from the second resistance varying state to the third resistance varying state.

5. The method according to claim 4, wherein
the application of the forming voltage pulse is finished in the forming step just before the resistance of the variable resistive element returns back to the initial resistance.

6. The method according to claim 3, wherein
the initial resistance is at a low resistance state,
the peak value is at a higher resistance state than the initial resistance,
the program resistive characteristic represents a high resistive characteristic, and the erase resistive characteristic represents a low resistive characteristic.

7. The method according to claim 1, wherein an absolute value of an applied voltage of the program voltage pulse is higher than an absolute value of an applied voltage of the erase voltage pulse.

8. A non-volatile semiconductor memory device comprising:

a memory cell having a two-port structure including a variable resistive element of which a resistive characteristic is varied by application of a voltage pulse to both ends;

a voltage pulse applying circuit capable of applying to both ends of the variable resistive element in the memory cell the forming voltage pulse in the forming step of the method according to claim 1, a program voltage pulse and an erase voltage pulse in a mono-polar switching action where the program voltage pulse is applied to the variable resistive element for first pulse application time in order to shift a variable resistive characteristic of the variable resistive element to a program resistive characteristic and the erase voltage pulse equal in the polarity to the program voltage pulse is applied to the variable resistive element for second pulse application time longer than the first pulse application time in order to shift the variable resistive characteristic of the variable resistive element to an erase resistive characteristic.

9. The non-volatile semiconductor memory device according to claim 8, wherein the variable resistive element in the memory cell become capable of the mono-polar switching action when subjected to the forming step.

10. The non-volatile semiconductor memory device according to claim 8, wherein the memory cell comprises a series circuit of the variable resistive element and a nonlinear element.

11. The non-volatile semiconductor memory device according to claim 8, wherein the memory cell has a two-port structure comprising a series circuit of the variable resistive element and a diode.

* * * * *